(12) United States Patent
Oganesian et al.

(10) Patent No.: US 9,362,203 B2
(45) Date of Patent: Jun. 7, 2016

(54) STAGED VIA FORMATION FROM BOTH SIDES OF CHIP

(71) Applicant: Tessera, Inc., San Jose, CA (US)

(72) Inventors: Vage Oganesian, Sunnyvale, CA (US); Belgacem Haba, Saratoga, CA (US); Ilyas Mohammed, Santa Clara, CA (US); Craig Mitchell, San Jose, CA (US); Piyush Savalia, San Jose, CA (US)

(73) Assignee: Tessera, Inc., San Jose, CA (US)

( * ) Notice: Subject to any disclaimer, the term of this patent is extended or adjusted under 35 U.S.C. 154(b) by 0 days.

(21) Appl. No.: 14/499,162

(22) Filed: Sep. 27, 2014

(65) Prior Publication Data

US 2015/0130077 A1    May 14, 2015

Related U.S. Application Data

(62) Division of application No. 12/884,649, filed on Sep. 17, 2010, now Pat. No. 8,847,380.

(51) Int. Cl.
*H01L 23/48* (2006.01)
*H01L 21/768* (2006.01)
(Continued)

(52) U.S. Cl.
CPC ........ *H01L 23/481* (2013.01); *H01L 21/76898* (2013.01); *H01L 23/50* (2013.01);
(Continued)

(58) Field of Classification Search
CPC ............... H01L 2924/00; H01L 2224/16145; H01L 2224/32145; H01L 2224/73204; H01L 2924/01322; H01L 2924/07811; H01L 2924/00012; H01L 21/76898; H01L 2224/0401; H01L 2224/05009; H01L 2224/06181
USPC ................ 257/774, 621, 778, 686, 698, 777; 438/660, 698, 667, 121
See application file for complete search history.

(56) References Cited

U.S. PATENT DOCUMENTS

| 4,074,342 A | 2/1978 | Honn et al. |
| 4,682,074 A | 7/1987 | Hoeberechts et al. |

(Continued)

FOREIGN PATENT DOCUMENTS

| CN | 1490875 A | 4/2004 |
| CN | 1758430 A | 4/2006 |

(Continued)

OTHER PUBLICATIONS

Chinese Office Action for Application No. 201010546793.9 dated Jun. 25, 2013.

(Continued)

*Primary Examiner* — Mohammed Shamsuzzaman

(57) ABSTRACT

A method of fabricating a semiconductor assembly can include providing a semiconductor element having a front surface, a rear surface, and a plurality of conductive pads, forming at least one hole extending at least through a respective one of the conductive pads by processing applied to the respective conductive pad from above the front surface, forming an opening extending from the rear surface at least partially through a thickness of the semiconductor element, such that the at least one hole and the opening meet at a location between the front and rear surfaces, and forming at least one conductive element exposed at the rear surface for electrical connection to an external device, the at least one conductive element extending within the at least one hole and at least into the opening, the conductive element being electrically connected with the respective conductive pad.

9 Claims, 27 Drawing Sheets

(51) Int. Cl.
*H01L 25/065* (2006.01)
*H01L 25/00* (2006.01)
*H01L 23/00* (2006.01)
*H01L 23/50* (2006.01)

(52) U.S. Cl.
CPC .............. *H01L 24/03* (2013.01); *H01L 24/05* (2013.01); *H01L 25/0657* (2013.01); *H01L 25/50* (2013.01); *H01L 2224/0401* (2013.01); *H01L 2224/05009* (2013.01); *H01L 2224/06181* (2013.01); *H01L 2224/16145* (2013.01); *H01L 2224/32145* (2013.01); *H01L 2224/73204* (2013.01); *H01L 2225/06513* (2013.01); *H01L 2225/06541* (2013.01); *H01L 2924/01322* (2013.01); *H01L 2924/07811* (2013.01); *H01L 2924/12042* (2013.01)

(56) References Cited

U.S. PATENT DOCUMENTS

| | | | |
|---|---|---|---|
| 4,765,864 A | 8/1988 | Holland et al. | |
| 4,941,033 A | 7/1990 | Kishida | |
| 4,996,627 A * | 2/1991 | Zias | G01L 9/0073 205/656 |
| 5,148,265 A | 9/1992 | Khandros et al. | |
| 5,148,266 A | 9/1992 | Khandros et al. | |
| 5,229,647 A | 7/1993 | Gnadinger | |
| 5,322,816 A | 6/1994 | Pinter | |
| 5,347,159 A | 9/1994 | Khandros et al. | |
| 5,481,133 A | 1/1996 | Hsu | |
| 5,679,977 A | 10/1997 | Khandros et al. | |
| 5,686,762 A | 11/1997 | Langley | |
| 5,700,735 A | 12/1997 | Shiue et al. | |
| 5,703,408 A | 12/1997 | Ming-Tsung et al. | |
| 5,808,874 A | 9/1998 | Hoeberechts et al. | |
| 5,821,608 A | 10/1998 | Distefano et al. | |
| 5,998,861 A | 12/1999 | Hiruta | |
| 6,002,161 A | 12/1999 | Yamazaki | |
| 6,005,466 A | 12/1999 | Pedder | |
| 6,013,948 A | 1/2000 | Akram et al. | |
| 6,022,758 A | 2/2000 | Badehi | |
| 6,031,274 A | 2/2000 | Muramatsu et al. | |
| 6,037,668 A | 3/2000 | Cave et al. | |
| 6,103,552 A | 8/2000 | Lin | |
| 6,143,369 A | 11/2000 | Sugawa et al. | |
| 6,143,396 A | 11/2000 | Saran et al. | |
| 6,169,319 B1 | 1/2001 | Malinovich et al. | |
| 6,181,016 B1 | 1/2001 | Lin et al. | |
| 6,261,865 B1 | 7/2001 | Akram | |
| 6,277,669 B1 | 8/2001 | Kung et al. | |
| 6,284,563 B1 | 9/2001 | Fjelstad | |
| 6,313,024 B1 | 11/2001 | Cave et al. | |
| 6,313,540 B1 | 11/2001 | Kida et al. | |
| 6,362,529 B1 * | 3/2002 | Sumikawa | H01L 23/481 257/686 |
| 6,368,410 B1 | 4/2002 | Gorczyca et al. | |
| 6,399,892 B1 | 6/2002 | Milkovich et al. | |
| 6,472,247 B1 | 10/2002 | Andoh et al. | |
| 6,492,201 B1 | 12/2002 | Haba | |
| 6,498,381 B2 | 12/2002 | Halahan et al. | |
| 6,498,387 B1 | 12/2002 | Yang | |
| 6,507,113 B1 | 1/2003 | Fillion et al. | |
| 6,555,913 B1 | 4/2003 | Sasaki et al. | |
| 6,586,955 B2 | 7/2003 | Fjelstad et al. | |
| 6,608,377 B2 | 8/2003 | Chang et al. | |
| 6,638,352 B2 | 10/2003 | Satsu et al. | |
| 6,693,358 B2 | 2/2004 | Yamada et al. | |
| 6,716,737 B2 | 4/2004 | Plas et al. | |
| 6,727,576 B2 | 4/2004 | Hedler et al. | |
| 6,737,300 B2 | 5/2004 | Ding et al. | |
| 6,743,660 B2 | 6/2004 | Lee et al. | |
| 6,790,775 B2 * | 9/2004 | Fartash | H01L 21/76898 257/621 |
| 6,812,549 B2 | 11/2004 | Umetsu et al. | |
| 6,828,175 B2 | 12/2004 | Wood et al. | |
| 6,864,172 B2 | 3/2005 | Noma et al. | |
| 6,867,123 B2 | 3/2005 | Katagiri et al. | |
| 6,873,054 B2 | 3/2005 | Miyazawa et al. | |
| 6,879,049 B1 | 4/2005 | Yamamoto et al. | |
| 6,914,336 B2 | 7/2005 | Matsuki et al. | |
| 6,927,156 B2 | 8/2005 | Mathew | |
| 6,982,475 B1 | 1/2006 | Macintyre | |
| 6,984,886 B2 * | 1/2006 | Ahn | H01L 23/12 174/255 |
| 7,026,175 B2 | 4/2006 | Li et al. | |
| 7,068,139 B2 | 6/2006 | Harris et al. | |
| 7,091,062 B2 | 8/2006 | Geyer | |
| 7,112,874 B2 | 9/2006 | Atlas | |
| 7,271,033 B2 | 9/2007 | Lin et al. | |
| 7,329,563 B2 | 2/2008 | Lo et al. | |
| 7,413,929 B2 | 8/2008 | Lee et al. | |
| 7,420,257 B2 | 9/2008 | Shibayama | |
| 7,436,069 B2 | 10/2008 | Matsui | |
| 7,446,036 B1 | 11/2008 | Bolom et al. | |
| 7,456,479 B2 | 11/2008 | Lan | |
| 7,531,445 B2 | 5/2009 | Shiv | |
| 7,531,453 B2 | 5/2009 | Kirby et al. | |
| 7,691,189 B2 * | 4/2010 | En | C23C 18/1607 106/1.23 |
| 7,719,121 B2 | 5/2010 | Humpston et al. | |
| 7,750,487 B2 | 7/2010 | Muthukumar et al. | |
| 7,754,531 B2 | 7/2010 | Tay et al. | |
| 7,767,497 B2 | 8/2010 | Haba | |
| 7,781,781 B2 | 8/2010 | Adkisson et al. | |
| 7,791,199 B2 | 9/2010 | Grinman et al. | |
| 7,807,508 B2 | 10/2010 | Oganesian et al. | |
| 7,829,976 B2 | 11/2010 | Kirby et al. | |
| 7,834,273 B2 | 11/2010 | Takahashi et al. | |
| 7,901,989 B2 | 3/2011 | Haba et al. | |
| 7,915,710 B2 | 3/2011 | Lee et al. | |
| 7,935,568 B2 | 5/2011 | Oganesian et al. | |
| 8,008,121 B2 | 8/2011 | Choi et al. | |
| 8,008,192 B2 | 8/2011 | Sulfridge | |
| 8,193,615 B2 | 6/2012 | Haba et al. | |
| 8,253,244 B2 | 8/2012 | Kang | |
| 8,263,434 B2 | 9/2012 | Pagaila et al. | |
| 8,299,608 B2 | 10/2012 | Bartley et al. | |
| 8,300,127 B2 * | 10/2012 | Akiyama | H01L 27/14623 257/72 |
| 8,310,036 B2 | 11/2012 | Haba et al. | |
| 8,405,196 B2 | 3/2013 | Haba et al. | |
| 8,421,193 B2 | 4/2013 | Huang | |
| 8,421,238 B2 | 4/2013 | Inagaki | |
| 2001/0028098 A1 | 10/2001 | Liou | |
| 2001/0048591 A1 | 12/2001 | Fjelstad et al. | |
| 2002/0048668 A1 | 4/2002 | Inoue | |
| 2002/0061723 A1 | 5/2002 | Duescher | |
| 2002/0096787 A1 | 7/2002 | Fjelstad | |
| 2002/0109236 A1 | 8/2002 | Kim et al. | |
| 2002/0151171 A1 * | 10/2002 | Furusawa | H01L 21/288 438/660 |
| 2003/0059976 A1 | 3/2003 | Nathan et al. | |
| 2003/0067074 A1 * | 4/2003 | Kinsman | H01L 23/49827 257/743 |
| 2003/0071331 A1 | 4/2003 | Yamaguchi et al. | |
| 2003/0178714 A1 | 9/2003 | Sakoda et al. | |
| 2004/0016942 A1 | 1/2004 | Miyazawa et al. | |
| 2004/0017012 A1 | 1/2004 | Yamada et al. | |
| 2004/0043607 A1 | 3/2004 | Farnworth et al. | |
| 2004/0051173 A1 | 3/2004 | Koh et al. | |
| 2004/0061238 A1 | 4/2004 | Se kine | |
| 2004/0104454 A1 | 6/2004 | Takaoka et al. | |
| 2004/0155354 A1 | 8/2004 | Hanaoka et al. | |
| 2004/0173891 A1 | 9/2004 | Imai et al. | |
| 2004/0178495 A1 | 9/2004 | Yean et al. | |
| 2004/0188819 A1 | 9/2004 | Farnworth et al. | |
| 2004/0188822 A1 | 9/2004 | Hara | |
| 2004/0217483 A1 | 11/2004 | Hedler et al. | |
| 2004/0222508 A1 | 11/2004 | Aoyagi | |
| 2004/0251525 A1 | 12/2004 | Zilber et al. | |
| 2004/0259292 A1 | 12/2004 | Beyne et al. | |
| 2005/0012225 A1 | 1/2005 | Choi et al. | |
| 2005/0046002 A1 | 3/2005 | Lee et al. | |

(56) References Cited

U.S. PATENT DOCUMENTS

| | | |
|---|---|---|
| 2005/0051883 A1 | 3/2005 | Fukazawa |
| 2005/0056903 A1 | 3/2005 | Yamamoto et al. |
| 2005/0099259 A1 | 5/2005 | Harris et al. |
| 2005/0106845 A1 | 5/2005 | Halahan et al. |
| 2005/0148160 A1 | 7/2005 | Farnworth et al. |
| 2005/0156330 A1 | 7/2005 | Harris |
| 2005/0181540 A1 | 8/2005 | Farnworth et al. |
| 2005/0248002 A1 | 11/2005 | Newman et al. |
| 2005/0260794 A1 | 11/2005 | Lo et al. |
| 2005/0279916 A1 | 12/2005 | Kang et al. |
| 2005/0282374 A1 | 12/2005 | Hwang et al. |
| 2005/0287783 A1 | 12/2005 | Kirby et al. |
| 2006/0001174 A1 | 1/2006 | Matsui |
| 2006/0001179 A1 | 1/2006 | Fukase et al. |
| 2006/0017161 A1 | 1/2006 | Chung et al. |
| 2006/0027934 A1* | 2/2006 | Edelstein ............... H01L 21/486 257/774 |
| 2006/0043598 A1 | 3/2006 | Kirby et al. |
| 2006/0046348 A1 | 3/2006 | Kang |
| 2006/0046463 A1 | 3/2006 | Watkins et al. |
| 2006/0046471 A1 | 3/2006 | Kirby et al. |
| 2006/0055050 A1 | 3/2006 | Numata et al. |
| 2006/0068580 A1 | 3/2006 | Dotta |
| 2006/0071347 A1 | 4/2006 | Dotta |
| 2006/0076019 A1 | 4/2006 | Ho |
| 2006/0079019 A1 | 4/2006 | Kim |
| 2006/0094231 A1 | 5/2006 | Lane et al. |
| 2006/0115932 A1 | 6/2006 | Farnworth et al. |
| 2006/0154446 A1 | 7/2006 | Wood et al. |
| 2006/0175697 A1 | 8/2006 | Kurosawa et al. |
| 2006/0197216 A1 | 9/2006 | Yee |
| 2006/0197217 A1 | 9/2006 | Yee |
| 2006/0264029 A1 | 11/2006 | Heck et al. |
| 2006/0278898 A1 | 12/2006 | Shibayama |
| 2006/0278997 A1* | 12/2006 | Gibson ............... H01L 23/49827 257/778 |
| 2006/0292866 A1 | 12/2006 | Borwick et al. |
| 2007/0035020 A1 | 2/2007 | Umemoto |
| 2007/0045779 A1 | 3/2007 | Hiatt |
| 2007/0052050 A1 | 3/2007 | Dierickx |
| 2007/0085215 A1* | 4/2007 | Budd ...................... G02B 6/43 257/778 |
| 2007/0096295 A1 | 5/2007 | Burtzlaff et al. |
| 2007/0126085 A1 | 6/2007 | Kawano et al. |
| 2007/0194427 A1 | 8/2007 | Choi et al. |
| 2007/0231966 A1 | 10/2007 | Egawa |
| 2007/0249095 A1 | 10/2007 | Song et al. |
| 2007/0262464 A1* | 11/2007 | Watkins ............ H01L 21/76898 257/774 |
| 2007/0266886 A1* | 11/2007 | En ...................... C23C 18/1607 106/1.18 |
| 2007/0269931 A1 | 11/2007 | Chung et al. |
| 2007/0290300 A1 | 12/2007 | Kawakami |
| 2008/0002460 A1 | 1/2008 | Tuckerman et al. |
| 2008/0020898 A1 | 1/2008 | Pyles et al. |
| 2008/0032448 A1 | 2/2008 | Simon et al. |
| 2008/0076195 A1 | 3/2008 | Shiv |
| 2008/0079779 A1 | 4/2008 | Cornell et al. |
| 2008/0090333 A1 | 4/2008 | Haba et al. |
| 2008/0099900 A1 | 5/2008 | Oganesian et al. |
| 2008/0099907 A1 | 5/2008 | Oganesian et al. |
| 2008/0111213 A1* | 5/2008 | Akram ................ H01L 21/6835 257/621 |
| 2008/0116544 A1 | 5/2008 | Grinman et al. |
| 2008/0136038 A1 | 6/2008 | Savastiouk et al. |
| 2008/0150089 A1 | 6/2008 | Kwon et al. |
| 2008/0157273 A1 | 7/2008 | Giraudin et al. |
| 2008/0164574 A1 | 7/2008 | Savastiouk et al. |
| 2008/0185719 A1 | 8/2008 | Cablao et al. |
| 2008/0230923 A1 | 9/2008 | Jo et al. |
| 2008/0246136 A1 | 10/2008 | Haba et al. |
| 2008/0274589 A1 | 11/2008 | Lee et al. |
| 2008/0284037 A1* | 11/2008 | Andry ................ H01L 21/6835 257/774 |
| 2008/0284041 A1 | 11/2008 | Jang et al. |
| 2008/0290525 A1* | 11/2008 | Anderson ............. H01L 21/486 257/774 |
| 2009/0008747 A1 | 1/2009 | Hoshino et al. |
| 2009/0014843 A1 | 1/2009 | Kawashita et al. |
| 2009/0026566 A1 | 1/2009 | Oliver et al. |
| 2009/0032951 A1 | 2/2009 | Andry et al. |
| 2009/0032966 A1 | 2/2009 | Lee et al. |
| 2009/0039491 A1 | 2/2009 | Kim et al. |
| 2009/0045504 A1 | 2/2009 | Suh |
| 2009/0065907 A1 | 3/2009 | Haba et al. |
| 2009/0085208 A1 | 4/2009 | Uchida |
| 2009/0108464 A1 | 4/2009 | Uchiyama |
| 2009/0133254 A1 | 5/2009 | Kubota et al. |
| 2009/0134498 A1 | 5/2009 | Ikeda et al. |
| 2009/0148591 A1 | 6/2009 | Wang et al. |
| 2009/0160030 A1* | 6/2009 | Tuttle ................ H01L 21/76898 257/621 |
| 2009/0166846 A1* | 7/2009 | Pratt ................. H01L 21/76898 257/698 |
| 2009/0212381 A1 | 8/2009 | Crisp et al. |
| 2009/0224372 A1 | 9/2009 | Johnson |
| 2009/0243047 A1 | 10/2009 | Wolter et al. |
| 2009/0263214 A1 | 10/2009 | Lee et al. |
| 2009/0267183 A1 | 10/2009 | Temple et al. |
| 2009/0267194 A1 | 10/2009 | Chen |
| 2009/0283662 A1 | 11/2009 | Wu et al. |
| 2009/0294983 A1 | 12/2009 | Cobbley et al. |
| 2009/0309235 A1 | 12/2009 | Suthiwongsunthorn et al. |
| 2010/0013060 A1 | 1/2010 | Lamy et al. |
| 2010/0013073 A1* | 1/2010 | Andry ................. H01L 21/6835 257/686 |
| 2010/0038778 A1 | 2/2010 | Lee et al. |
| 2010/0044079 A1* | 2/2010 | Kosowsky ............. C25D 5/022 174/250 |
| 2010/0105169 A1 | 4/2010 | Lee et al. |
| 2010/0117242 A1 | 5/2010 | Miller et al. |
| 2010/0127346 A1 | 5/2010 | DeNatale et al. |
| 2010/0148371 A1 | 6/2010 | Kaskoun et al. |
| 2010/0155940 A1 | 6/2010 | Kawashita et al. |
| 2010/0159699 A1 | 6/2010 | Takahashi |
| 2010/0164062 A1 | 7/2010 | Wang et al. |
| 2010/0167534 A1 | 7/2010 | Iwata |
| 2010/0193964 A1 | 8/2010 | Farooq et al. |
| 2010/0225006 A1 | 9/2010 | Haba et al. |
| 2010/0230795 A1 | 9/2010 | Kriman et al. |
| 2010/0258917 A1 | 10/2010 | Lin |
| 2011/0061911 A1* | 3/2011 | Jeon ..................... H01L 21/4857 174/258 |
| 2011/0089573 A1 | 4/2011 | Ku Rita |
| 2011/0099807 A1* | 5/2011 | Kim ....................... H05K 3/381 29/852 |
| 2011/0233777 A1* | 9/2011 | Akram ................ H01L 21/6835 257/738 |
| 2011/0266674 A1 | 11/2011 | Hsia et al. |
| 2012/0007232 A1 | 1/2012 | Haba |
| 2012/0018863 A1 | 1/2012 | Oganesian et al. |
| 2012/0018868 A1 | 1/2012 | Oganesian et al. |
| 2012/0018893 A1 | 1/2012 | Oganesian et al. |
| 2012/0018894 A1* | 1/2012 | Oganesian ........ H01L 21/76898 257/773 |
| 2012/0018895 A1 | 1/2012 | Oganesian et al. |
| 2012/0020026 A1 | 1/2012 | Oganesian et al. |
| 2012/0025365 A1 | 2/2012 | Haba |
| 2012/0068327 A1* | 3/2012 | Oganesian .......... H01L 21/6835 257/692 |
| 2012/0068330 A1 | 3/2012 | Oganesian et al. |
| 2012/0068352 A1 | 3/2012 | Oganesian et al. |
| 2012/0094443 A1* | 4/2012 | Pratt ................. H01L 21/76898 438/121 |
| 2012/0139082 A1* | 6/2012 | Oganesian ........ H01L 21/76898 257/531 |
| 2012/0139094 A1* | 6/2012 | Haba ................... H01L 25/0657 257/690 |
| 2012/0139124 A1* | 6/2012 | Oganesian ............ H01L 23/481 257/774 |

(56) References Cited

U.S. PATENT DOCUMENTS

2013/0029031 A1* 1/2013 Jeon .................. H01L 21/4857
427/96.2

FOREIGN PATENT DOCUMENTS

| | | | |
|---|---|---|---|
| CN | 101675516 | A | 3/2010 |
| CN | 201910420 | U | 7/2011 |
| EP | 0316799 | A1 | 5/1989 |
| EP | 0926723 | A1 | 6/1999 |
| EP | 1482553 | A2 | 12/2004 |
| EP | 1519410 | A1 | 3/2005 |
| EP | 1551060 | A1 | 7/2005 |
| EP | 1619722 | A2 | 1/2006 |
| EP | 1653510 | A2 | 5/2006 |
| EP | 1653521 | A1 | 5/2006 |
| EP | 1686627 | A1 | 8/2006 |
| JP | 1106949 | A | 4/1989 |
| JP | 4365558 | A | 12/1992 |
| JP | 08-213427 | A | 8/1996 |
| JP | 11016949 | A | 1/1999 |
| JP | 11195706 | A | 7/1999 |
| JP | 2001085559 | A | 3/2001 |
| JP | 2001-217386 | A | 8/2001 |
| JP | 2002016178 | A | 1/2002 |
| JP | 2002162212 | A | 6/2002 |
| JP | 2002217331 | A | 8/2002 |
| JP | 2002373957 | A | 12/2002 |
| JP | 2003318178 | A | 11/2003 |
| JP | 2004165602 | A | 6/2004 |
| JP | 2004200547 | A | 7/2004 |
| JP | 2005026405 | A | 1/2005 |
| JP | 2005093486 | A | 4/2005 |
| JP | 2005101268 | A | 4/2005 |
| JP | 2005209967 | A | 8/2005 |
| JP | 2005216921 | A | 8/2005 |
| JP | 2007053149 | A | 3/2007 |
| JP | 2007157844 | A | 6/2007 |
| JP | 2008-091632 | A | 12/2007 |
| JP | 2007317887 | A | 12/2007 |
| JP | 2008-177249 | A | 7/2008 |
| JP | 2008227335 | A | 9/2008 |
| KR | 19990088037 | | 12/1999 |
| KR | 20040066018 | A | 7/2004 |
| KR | 20060009407 | A | 1/2006 |
| KR | 2006-0020822 | A | 3/2006 |
| KR | 20070065241 | A | 6/2007 |
| KR | 100750741 | B1 | 8/2007 |
| TW | 201025501 | A | 7/2010 |
| WO | 03/025998 | A2 | 3/2003 |
| WO | 2004114397 | | 12/2004 |
| WO | 2008108970 | A2 | 9/2008 |
| WO | 2009017758 | A2 | 2/2009 |
| WO | 2010104637 | A1 | 9/2010 |

OTHER PUBLICATIONS

Taiwanese Office Action for Application No. 099143374 dated Jun. 24, 2013.
Chinese Office Action for Application No. 201010546210.2 dated Aug. 21, 2013.
Preliminary Examination Report from Taiwan Application No. 099140226 dated Oct. 21, 2013.
Japanese Office Action for Application No. 2009-552696 dated Nov. 1, 2013.
Taiwanese Office Action for Application No. 100133520 dated Dec. 12, 2013.
David R. Lide et al: 'Handbook of Chemistry and Physics, 77th Edition, 1996-1997', Jan. 1, 1997, CRC Press, Boca Raton, New York, London, Tokyo, XP002670569, pp. 12-90-12-91.
International Search Report and Written Opinion, PCT/US2011/063025, Mar. 19, 2012.
International Search Report Application No. PCT/US2011/029568, dated Aug. 30, 2011.
International Search Report Application No. PCT/US2011/029568, dated Oct. 21, 2011.
Extended European Search Report for Application No. EP12189442 dated Mar. 6, 2014.
Taiwan Office Action for Application No. 100144451 dated Apr. 16, 2014.
International Search Report and Written Opinion for Application No. PCT/US2011/060553 dated Oct. 26, 2012.
International Written Opinion for Application No. PCT/US2011/063653 dated Jan. 14, 2013.
Japanese Office Action for Application No. 2010-519953 dated Oct. 19, 2012.
Japanese Office Action for Application No. 2009-552696 dated Aug. 14, 2012.
Partial International Search Report, PCT/US2008/002659.
International Search Report, PCT/US2008/002659, Oct. 17, 2008.
PCT/US08/09207, "Reconstituted Wafer Stack Packaging With After Applied Pad Extensions," filed Jul. 25, 2008.
International Search Report and Written Opinion, PCT/US2008/009356 dated Feb. 19, 2009.
International Search Report and Written Opinion, PCT/US2010/002318, dated Nov. 22, 2010.
International Search Report and Written Opinion, PCT/US2010/052458, dated Jan. 31, 2011.
Supplementary European Search Report, EP 08795005 dated Jul. 5, 2010.
International Search Report, PCT/US10/52783, Dated Dec. 10, 2010.
International Search Report and Written Opinion, PCT/US2010/052785, Dated Dec. 20, 2010.
International Search Report and Written Opinion for PCT/US2011/051552 dated Apr. 11, 2012.
International Search Report and Written Opinion for PCT/US2011/051556 dated Feb. 13, 2012.
International Search Report and Written Opinion for Application No. PCT/US2011/029394 dated Jun. 6, 2012.
International Search Report and Written Opinion for Application No. PCT/US2011/063653 dated Aug. 13, 2012.
International Searching Authority, Search Report for Application No. PCT/US2011/060553 dated Jun. 27, 2012.
Partial International Search Report for Application No. PCT/US2011/063653 dated Jul. 9, 2012.
Taiwan Office Action for Application No. 100113585 dated Jun. 5, 2012.

* cited by examiner

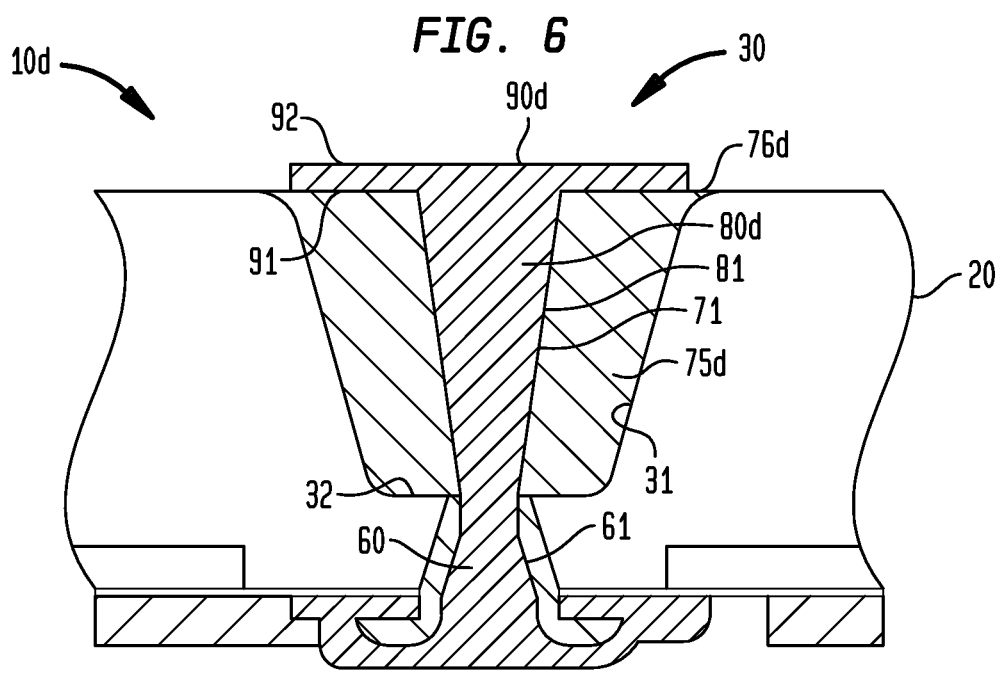

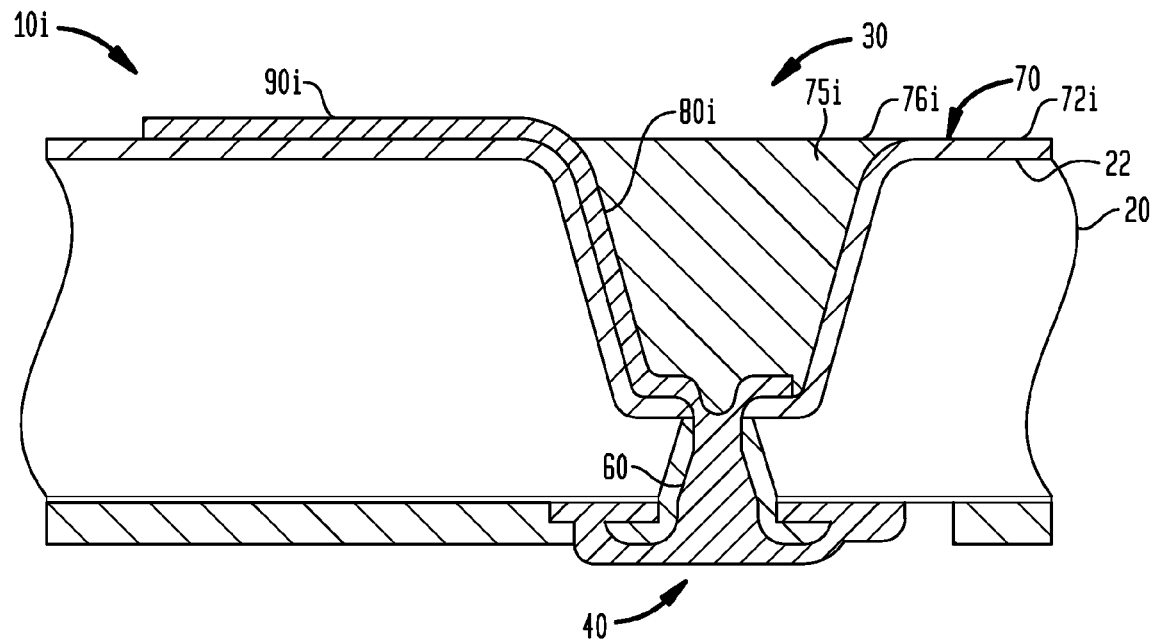

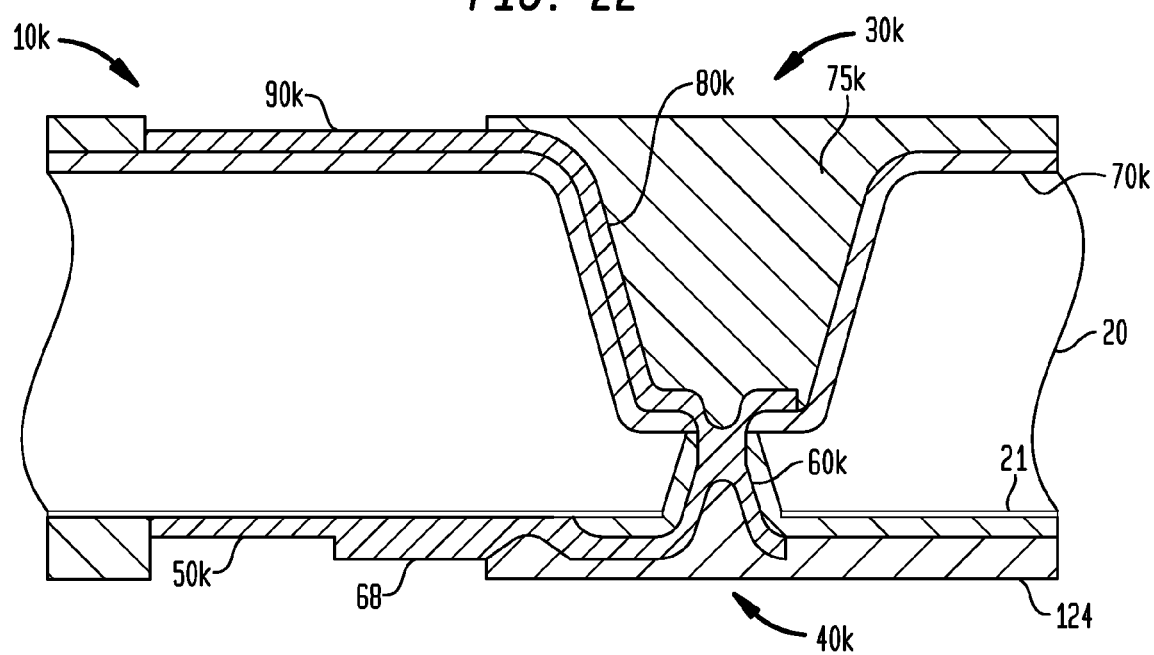

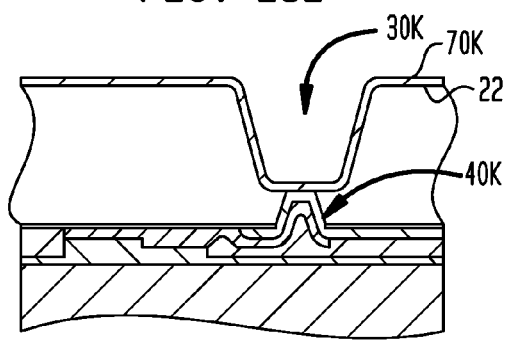
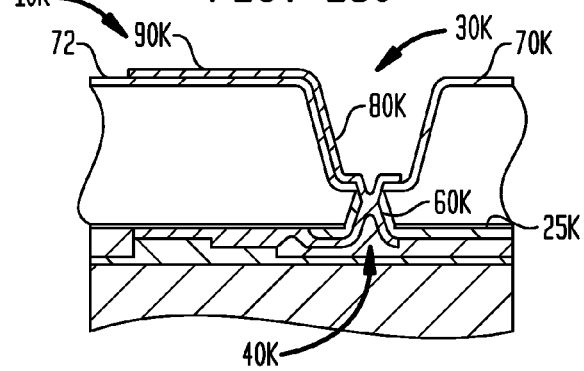
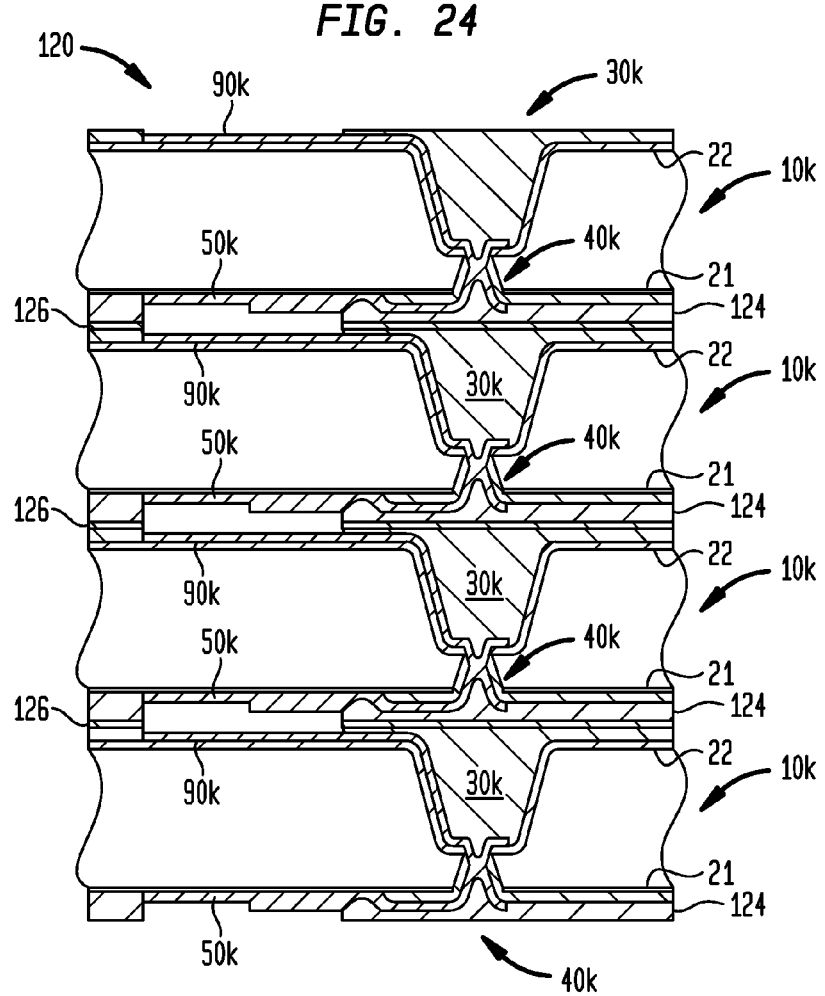

STAGED VIA FORMATION FROM BOTH SIDES OF CHIP

CROSS-REFERENCE TO RELATED APPLICATIONS

The present application is a continuation of U.S. application Ser. No. 12/884,649 filed Sep. 17, 2010, which is incorporated herein by reference.

BACKGROUND OF THE INVENTION

The present invention relates to packaging of microelectronic devices, especially the packaging of semiconductor devices.

Microelectronic elements generally comprise a thin slab of a semiconductor material, such as silicon or gallium arsenide, commonly called a die or a semiconductor chip. Semiconductor chips are commonly provided as individual, prepackaged units. In some unit designs, the semiconductor chip is mounted to a substrate or chip carrier, which is in turn mounted on a circuit panel, such as a printed circuit board.

The active circuitry is fabricated in a first face of the semiconductor chip (e.g., a front surface). To facilitate electrical connection to the active circuitry, the chip is provided with bond pads on the same face. The bond pads are typically placed in a regular array either around the edges of the die or, for many memory devices, in the die center. The bond pads are generally made of a conductive metal, such as copper, or aluminum, around 0.5 µm thick. The bond pads could include a single layer or multiple layers of metal. The size of the bond pads will vary with the device type but will typically measure tens to hundreds of microns on a side.

Through-silicon vias (TSVs) are used to connect the bond pads with a second face of the semiconductor chip opposite the first face (e.g., a rear surface). A conventional via includes a hole penetrating through the semiconductor chip and a conductive material extending through the hole from the first face to the second face. The bond pads may be electrically connected to vias to allow communication between the bond pads and conductive elements on the second face of the semiconductor chip.

Conventional TSV holes may reduce the portion of the first face that can be used to contain the active circuitry. Such a reduction in the available space on the first face that can be used for active circuitry may increase the amount of silicon required to produce each semiconductor chip, thereby potentially increasing the cost of each chip.

Conventional vias may have reliability challenges because of a non-optimal stress distribution inside of the vias and a mismatch of the coefficient of thermal expansion (CTE) between a semiconductor chip, for example, and the structure to which the chip is bonded. For example, when conductive vias within a semiconductor chip are insulated by a relatively thin and stiff dielectric material, significant stresses may be present within the vias. In addition, when the semiconductor chip is bonded to conductive elements of a polymeric substrate, the electrical connections between the chip and the higher CTE structure of the substrate will be under stress due to CTE mismatch.

Size is a significant consideration in any physical arrangement of chips. The demand for more compact physical arrangements of chips has become even more intense with the rapid progress of portable electronic devices. Merely by way of example, devices commonly referred to as "smart phones" integrate the functions of a cellular telephone with powerful data processors, memory and ancillary devices such as global positioning system receivers, electronic cameras, and local area network connections along with high-resolution displays and associated image processing chips. Such devices can provide capabilities such as full internet connectivity, entertainment including full-resolution video, navigation, electronic banking and more, all in a pocket-size device. Complex portable devices require packing numerous chips into a small space. Moreover, some of the chips have many input and output connections, commonly referred to as "I/O's." These I/O's must be interconnected with the I/O's of other chips. The interconnections should be short and should have low impedance to minimize signal propagation delays. The components which form the interconnections should not greatly increase the size of the assembly. Similar needs arise in other applications as, for example, in data servers such as those used in internet search engines. For example, structures which provide numerous short, low-impedance interconnects between complex chips can increase the bandwidth of the search engine and reduce its power consumption.

Despite the advances that have been made in semiconductor via formation and interconnection, further improvements can still be made.

SUMMARY OF TEE INVENTION

In accordance with an aspect of the invention, a method of fabricating a semiconductor assembly can include providing a semiconductor element having a front surface, a rear surface remote from the front surface, and a plurality of conductive pads. Each pad can have a top surface exposed at the front surface and can have a bottom surface remote from the top surface. The method can also include forming at least one hole extending at least through a respective one of the conductive pads by processing applied to the respective conductive pad from above the front surface. The method can also include forming an opening extending from the rear surface at least partially through a thickness of the semiconductor element, such that the at least one hole and the opening meet at a location between the front and rear surfaces. The method can also include forming at least one conductive element exposed at the rear surface for electrical connection to an external device. The at least one conductive element can extend within the at least one hole and at least into the opening. The conductive element can be electrically connected with the respective conductive pad.

In a particular embodiment, the method can also include forming a continuous dielectric layer partially overlying the respective conductive pad at least at a location above the respective conductive pad and overlying an interior surface of the semiconductor element within the hole. In an exemplary embodiment, the step of forming the at least one conductive element can form at least one conductive interconnect coupled directly or indirectly to the respective conductive pad and at least one conductive contact coupled to the respective conductive interconnect. The at least one conductive contact can be exposed at the rear surface. In a particular embodiment, the at least one conductive contact can overlie the rear surface of the semiconductor element. In one embodiment, the opening can have a first width in a lateral direction along the rear surface, and at least one of the conductive contacts can have a second width in the lateral direction, the first width being greater than the second width. In a particular embodiment, the at least one contact can be aligned in a vertical direction with a portion of the semiconductor element within the opening, the vertical direction being a direction of the thickness of the semiconductor element.

In an exemplary embodiment, the step of forming the at least one hole can be performed such that the at least one hole extends partially through the thickness of the semiconductor element. In one embodiment, the step of forming the at least one hole can be performed such that the at least one hole extends up to one-third of the distance between the front surface and the rear surface through the thickness of the semiconductor element. The opening can extend through a remainder of the thickness of the semiconductor element that is not occupied by the at least one hole. In a particular embodiment, the semiconductor element can include a plurality of active semiconductor devices. At least one of the plurality of conductive pads can be electrically connected with at least one of the plurality of active semiconductor devices. In an exemplary embodiment, one or more of any of the holes and the opening can be formed by directing a jet of fine abrasive particles towards the semiconductor element.

In one embodiment, the step of forming the at least one hole can form two or more holes. The step of forming the opening can be performed such that the opening extends from the rear surface of the semiconductor element to two or more of the holes. In a particular embodiment, the step of forming the opening can be performed such that the opening has a channel shape having a length extending in a first direction along a surface of the semiconductor element, and a width extending a second lateral direction transverse to said first direction, the length being greater than the width. In an exemplary embodiment, the processing that can be applied to the respective conductive pad from above the front surface can be chemical etching, laser drilling, or plasma etching. In one embodiment, a method of fabricating a stacked assembly can include at least first and second semiconductor assemblies. The method can also include the step of electrically connecting the first semiconductor assembly with the second semiconductor assembly.

In a particular embodiment, the step of forming at least one conductive element can form at least one conductive interconnect exposed at the rear surface for electrical connection to an external device, and at least one conductive via. The at least one conductive interconnect can extend at least into the opening. Each via can extend within a respective hole and can be coupled to a respective conductive interconnect and a respective pad. In one embodiment, the step of forming at least one conductive element can form two or more conductive interconnects. A plurality of the holes can meet the opening and the conductive interconnects can extend at least within the opening to the respective vias. In an exemplary embodiment, each conductive interconnect can be formed by plating a metal layer overlying at least an inner surface of the opening. The conductive interconnect can conform to a contour of the opening. In a particular embodiment, the conductive interconnects can extend along respective portions of the inner surface of the opening.

In one embodiment, the step of forming at least one conductive element can be performed so as to form two or more conductive interconnects at least within the opening. Each of the two or more conductive interconnects can extend to a single one of the conductive vias. In an exemplary embodiment, each conductive interconnect can define an internal space. In a particular embodiment, the method can also include the step of filling each internal space with a dielectric material. In one embodiment, the method can also include the step of forming a dielectric layer overlying at least the inner surface of the opening. Each conductive interconnect can fill a volume between surfaces of the dielectric layer.

In an exemplary embodiment, the method can also include forming a dielectric region within the opening and forming an aperture extending through the dielectric region. The aperture can have constant diameter or can taper in a direction towards the front surface and can have a contour not conforming to a contour of the opening. The step of forming the at least one conductive element can form a respective one of the conductive interconnects at least within the aperture. In a particular embodiment, the respective one of the conductive interconnects can have a cylindrical or frusto-conical shape. In one embodiment, the respective one of the conductive interconnects can be formed by plating a metal layer onto an inner surface of the aperture. In an exemplary embodiment, the respective one of the conductive interconnects can define an internal space.

In a particular embodiment, the method can also include the step of filling the internal space with a dielectric material. In one embodiment, the respective one of the conductive interconnects can fill a volume within the aperture. In an exemplary embodiment, at least one of the conductive vias can be formed by plating a metal layer overlying at least an inner surface of the respective one of the holes. The conductive via can conform to a contour of the hole. In a particular embodiment, each of the at least one of the conductive vias can define an internal space. In one embodiment, the method can also include the step of filling each internal space with a dielectric material. In an exemplary embodiment, the method can also include the step of forming a dielectric layer overlying at least the inner surface of the respective one of the holes. Each of the at least one of the conductive vias can fill a volume between surfaces of the dielectric layer.

In one embodiment, the method can also include, prior to the step of forming the opening, forming a dielectric region within each hole and forming an aperture extending through each dielectric region. The aperture can have constant diameter or can taper in a direction towards the rear surface and can have a contour not conforming to a contour of the hole. The step of forming the at least one conductive element can form a respective one of the conductive vias at least within the aperture. In an exemplary embodiment, the respective one of the conductive vias can have a cylindrical or frusto-conical shape. In a particular embodiment, the respective one of the conductive vias can be formed by plating a metal layer overlying an inner surface of the aperture. In one embodiment, each of the at least one of the conductive vias can define an internal space.

In an exemplary embodiment, the method can also include the step of filling each internal space with a dielectric material. In a particular embodiment, each of the at least one of the conductive vias can fill a volume within the aperture. In one embodiment, each conductive via can have a first width at a top end thereof, and each conductive interconnect can have a second width at a bottom end thereof that meets the top end of a respective one of the conductive vias, the second width being different than the first width. In an exemplary embodiment, the step of forming at least one conductive element can be performed so as to form at least one conductive interconnect exposed at the rear surface for electrical connection to an external device. The at least one conductive interconnect can extend within the at least one hole and at least into the opening. Each conductive interconnect can extend to a respective pad.

In a particular embodiment, the step of forming at least one conductive element can form two or more conductive interconnects. A plurality of the holes can meet the opening and the conductive interconnects can extend at least within the opening and through the respective holes to the respective pads. In one embodiment, the method can also include forming a dielectric region within the hole and the opening and forming an aperture extending through the dielectric region. The aperture can have a contour not conforming to either a contour of the hole or a contour of the opening. The step of forming the at least one conductive element can form a respective one of the conductive interconnects at least within the aperture. In an exemplary embodiment, the respective one of the conductive interconnects can have a cylindrical or frusto-conical shape. In a particular embodiment, the respective one of the conductive interconnects can be formed by plating a metal layer overlying an inner surface of the aperture.

In accordance with an aspect of the invention, a semiconductor assembly includes a semiconductor element having a front surface, a rear surface remote from the front surface, and an opening extending from the rear surface at least partially through the thickness of the semiconductor element. The semiconductor element can further include a plurality of conductive pads at the front surface. The semiconductor assembly can also include at least one hole extending through the conductive pad and partially through the thickness of the semiconductor element. The at least one hole can meet the opening at a location between the front and rear surfaces. At the location where the hole and the opening meet, interior surfaces of the hole and the opening can extend at different angles relative to the rear surface such that there can be a step change between slopes of the interior surfaces of the hole and the opening. The semiconductor assembly can also include a continuous dielectric layer partially overlying the conductive pad at least at a location above the conductive pad and overlying an interior surface of the semiconductor material within the hole. The semiconductor assembly can also include at least one conductive element electrically contacting the respective conductive pad. The at least one conductive element can have a first portion exposed at the rear surface for electrical connection with an external device. The at least one conductive element can have a second portion overlying the continuous dielectric layer at least at a location above the conductive pad.

In accordance with an aspect of the invention, a semiconductor assembly includes a semiconductor element having a front surface, a rear surface remote from the front surface, and an opening extending from the rear surface at least partially through the thickness of the semiconductor element. The semiconductor element can further include a plurality of conductive pads at the front surface. The semiconductor assembly can also include at least one hole extending through the conductive pad and partially through the thickness of the semiconductor element. The at least one hole can meet the opening at a location between the front and rear surfaces. At the location where the hole and the opening meet, interior surfaces of the hole and the opening can extend at different angles relative to the rear surface such that there can be a step change between slopes of the interior surfaces of the hole and the opening. The semiconductor assembly can also include a continuous dielectric layer overlying an interior surface of the conductive pad within the hole and overlying an interior surface of the semiconductor material within the hole. The semiconductor assembly can also include at least one conductive element electrically contacting the respective conductive pad. The at least one conductive element can have a first portion exposed at the rear surface for electrical connection with an external device. The at least one conductive element can have a second portion overlying the continuous dielectric layer.

In a particular embodiment, the at least one conductive pad can have an outwardly facing surface facing away from the semiconductor element. At least a portion of the dielectric layer can contact the outwardly-facing surface. In one embodiment, the at least one conductive element can include at least one conductive interconnect coupled directly or indirectly to the respective conductive pad and at least one conductive contact coupled to the respective conductive interconnect. The at least one conductive contact can be exposed at the rear surface. In an exemplary embodiment, the at least one conductive contact can overlie the rear surface of the semiconductor element. In a particular embodiment, the opening can have a first width in a lateral direction along the rear surface, and at least one of the conductive contacts can have a second width in the lateral direction, the first width being greater than the second width.

In one embodiment, the at least one contact can be aligned in a vertical direction with a portion of the semiconductor element within the opening, the vertical direction being a direction of the thickness of the semiconductor element. In an exemplary embodiment, the semiconductor element can include a plurality of active semiconductor devices and at least one of the plurality of conductive pads can be electrically connected with at least one of the plurality of active semiconductor devices. In a particular embodiment, the at least one hole can be two or more holes, and the opening can extend from the rear surface of the semiconductor element to two or more of the holes. In one embodiment, the opening can have a channel shape having a length extending in a first direction along a surface of the semiconductor element, and a width extending a second lateral direction transverse to said first direction, the length being greater than the width.

In an exemplary embodiment, the at least one conductive pad can have an outwardly facing surface facing away from the semiconductor element. At least a portion of the at least one conductive element can overlie the outwardly-facing surface and can be electrically connected thereto. In a particular embodiment, a stacked assembly can include at least first and second semiconductor assemblies. The first semiconductor assembly can be electrically connected with the second semiconductor assembly. In one embodiment, the at least one conductive element can include at least one conductive interconnect exposed at the rear surface for electrical connection to an external device, and at least one conductive via. The at least one conductive interconnect can extend at least into the opening. Each via can extend within a respective hole and can be coupled to a respective conductive interconnect and a respective pad. In an exemplary embodiment, the at least one conductive element can include two or more conductive interconnects. A plurality of the holes can meet the opening and the conductive interconnects can extend at least within the opening to the respective vias.

In a particular embodiment, each conductive interconnect can overlie at least an inner surface of the opening. The conductive interconnect can conform to a contour of the opening. In one embodiment, the conductive interconnects can extend along respective portions of the inner surface of the opening. In an exemplary embodiment, the at least one conductive element can include two or more conductive interconnects extending at least within the opening. Each of the two or more conductive interconnects can extend to a single one of the conductive vias. In a particular embodiment, each conductive interconnect can define an internal space. In one embodiment, each internal space can be at least partially filled with a dielectric material. In an exemplary embodiment, the semiconductor assembly can also include a dielectric layer overlying at least the inner surface of the opening. Each conductive interconnect can fill a volume between surfaces of the dielectric layer.

In one embodiment, the semiconductor assembly can also include a dielectric region disposed within the opening and an aperture extending through the dielectric region. The aperture can have constant diameter or can taper in a direction towards the front surface and can have a contour not conforming to a contour of the opening. A respective one of the conductive interconnects can extend at least within the aperture. In an exemplary embodiment, the respective one of the conductive interconnects can have a cylindrical or frusto-conical shape. In a particular embodiment, the respective one of the conductive interconnects can define an internal space. In one embodiment, the internal space can be at least partially filled with a dielectric material. In an exemplary embodiment, the respective one of the conductive interconnects can fill a volume within the aperture. In a particular embodiment, at least one of the conductive vias can overlie at least an inner surface of the respective one of the holes. The conductive via can conform to a contour of the hole.

In an exemplary embodiment, each of the at least one of the conductive vias can define an internal space. In one embodiment, each internal space can be at least partially filled with a dielectric material. In a particular embodiment, the semiconductor assembly can also include a dielectric layer overlying at least the inner surface of the respective one of the holes. Each of the at least one of the conductive vias can fill a volume between surfaces of the dielectric layer. In an exemplary embodiment, the semiconductor assembly can also include a dielectric region disposed within each hole and an aperture extending through each dielectric region. The aperture can have constant diameter or can taper in a direction towards the rear surface and can have a contour not conforming to a contour of the hole. A respective one of the conductive vias can extend at least within the aperture. In a particular embodiment, the respective one of the conductive vias can have a cylindrical or frusto-conical shape. In one embodiment, each of the at least one of the conductive vias can define an internal space.

In a particular embodiment, each internal space can be at least partially filled with a dielectric material. In an exemplary embodiment, each of the at least one of the conductive vias can fill a volume within the aperture. In one embodiment, each conductive via can have a first width at a top end thereof, and each conductive interconnect can have a second width at a bottom end thereof that meets the top end of a respective one of the conductive vias, the second width being different than the first width. In a particular embodiment, the at least one conductive element can include at least one conductive interconnect exposed at the rear surface for electrical connection to an external device. The at least one conductive interconnect can extend within the at least one hole and at least into the opening. Each conductive interconnect can extend to a respective pad.

In an exemplary embodiment, the at least one conductive element can include two or more conductive interconnects. A plurality of the holes can meet the opening and the conductive interconnects can extend at least within the opening and through the respective holes to the respective pads. In one embodiment, the semiconductor assembly can also include a dielectric region disposed within the hole and the opening and an aperture extending through the dielectric region. The aperture can have a contour not conforming to either a contour of the hole or a contour of the opening. A respective one of the conductive interconnects can extend at least within the aperture. In a particular embodiment, the respective one of the conductive interconnects can have a cylindrical or frusto-conical shape.

In accordance with an aspect of the invention, a semiconductor assembly includes a semiconductor element having a front surface, a rear surface remote from the front surface, an opening extending from the rear surface at least partially through the thickness of the semiconductor element, and a hole extending from the front surface at least partially through the thickness of the semiconductor element. The hole and the opening can meet at a location between the front and rear surfaces. The semiconductor element can further include a plurality of conductive pads at the front surface. At least one conductive pad can be laterally offset from the hole. The semiconductor assembly can also include at least one conductive element having a portion exposed at the rear surface for electrical connection with an external device. The at least one conductive element can extend within the hole and at least into the opening. The at least one conductive element can only partially overlie a surface of the respective conductive pad.

In a particular embodiment, the at least one conductive element can include at least one conductive interconnect exposed at the rear surface for electrical connection to an external device, and at least one conductive via. The at least one conductive interconnect can extend at least into the opening. Each via can extend within a respective hole and can be coupled to a respective conductive interconnect and a respective pad. In one embodiment, at least one of the conductive vias can overlie at least an inner surface of the respective one of the holes. The conductive via can conform to a contour of the hole. In an exemplary embodiment, each of the at least one of the conductive vias can define an internal space. In a particular embodiment, each internal space can be at least partially filled with a dielectric material.

Further aspects of the invention provide systems which incorporate microelectronic structures according to the foregoing aspects of the invention, composite chips according to the foregoing aspects of the invention, or both in conjunction with other electronic devices. For example, the system may be disposed in a single housing, which may be a portable housing. Systems according to preferred embodiments in this aspect of the invention may be more compact than comparable conventional systems.

BRIEF DESCRIPTION OF TEE DRAWINGS

FIG. 6 is a sectional view illustrating a via structure in accordance with another embodiment.

FIG. 14 is a sectional view illustrating a via structure in accordance with another embodiment.

FIG. 22 is a sectional view illustrating a via structure in accordance with another embodiment.

FIGS. 23A-23J are sectional views illustrating stages of fabrication in accordance with the embodiment of the invention depicted in FIG. 22.

FIG. 24 is a sectional view illustrating a stacked assembly including a plurality of packaged chips having a via structure as shown in FIG. 22.

DETAILED DESCRIPTION

Figure 1:
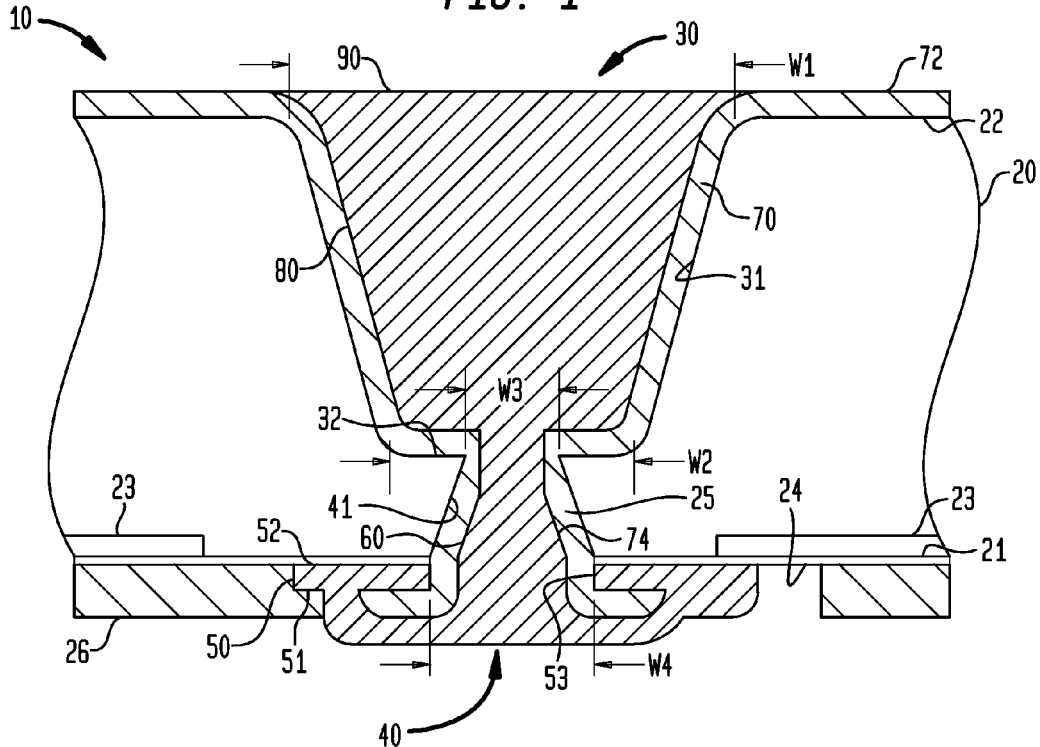
FIG. 1 is a sectional view illustrating a via structure in accordance with an embodiment of the invention.

FIG. 1 is a sectional view illustrating a via structure in accordance with an embodiment of the invention. As illustrated in FIG. 1, a microelectronic unit 10 includes a semiconductor element 20 having an opening 30 extending from a rear surface 22 partially through the semiconductor element 20 towards a front surface 21 remote from the rear surface. The semiconductor element 20 also has a hole 40 extending through a conductive pad 50 exposed at the front surface, the hole and the opening 30 meeting at a location between the front surface and the rear surface 22. A conductive via 60 extends within the hole 40, and a conductive interconnect 80 extends within the opening 30 and has a surface 90 exposed at the rear surface that can serve as a contact for electrical connection with an external device.

In FIG. 1, the directions parallel to front surface are referred to herein as "horizontal" or "lateral" directions; whereas the directions perpendicular to the front surface are referred to herein as upward or downward directions and are also referred to herein as the "vertical" directions. The directions referred to herein are in the frame of reference of the structures referred to. Thus, these directions may lie at any orientation to the normal or gravitational frame of reference. A statement that one feature is disposed at a greater height "above a surface" than another feature means that the one feature is at a greater distance in the same orthogonal direction away from the surface than the other feature. Conversely, a statement that one feature is disposed at a lesser height "above a surface" than another feature means that the one feature is at a smaller distance in the same orthogonal direction away from the surface than the other feature.

The semiconductor element 20 can include a semiconductor substrate, which can be made from silicon, for example. A plurality of active semiconductor devices (e.g., transistors, diodes, etc.) can be disposed in an active semiconductor region 23 thereof located at and/or below the front surface 21. The plurality of active semiconductor devices can be electrically connected to the conductive pad 50 for interconnection to other internal and/or external components. As shown in FIG. 1, an edge of the conductive pad 50 can overlie the active semiconductor region 23, or the conductive pad can be laterally offset from the active semiconductive region. The thickness of the semiconductor element 20 between the front surface 21 and the rear surface 22 typically is less than 200 µm, and can be significantly smaller, for example, 130 µm, 70 µm or even smaller.

The semiconductor element 20 can further include a dielectric layer 24 located between the front surface 21 and the conductive pad 50. The dielectric layer 24 electrically insulates the conductive pad 50 from the semiconductor element 20. This dielectric layer 24 can be referred to as a "passivation layer" of the microelectronic unit 10. The dielectric layer 24 can include an inorganic or organic dielectric material or both. The dielectric layer 24 may include an electrodeposited conformal coating or other dielectric material, for example, a photoimageable polymeric material, for example, a solder mask material. The dielectric layer 24 may include one or more layers of oxide material or other dielectric material.

Figure 11:
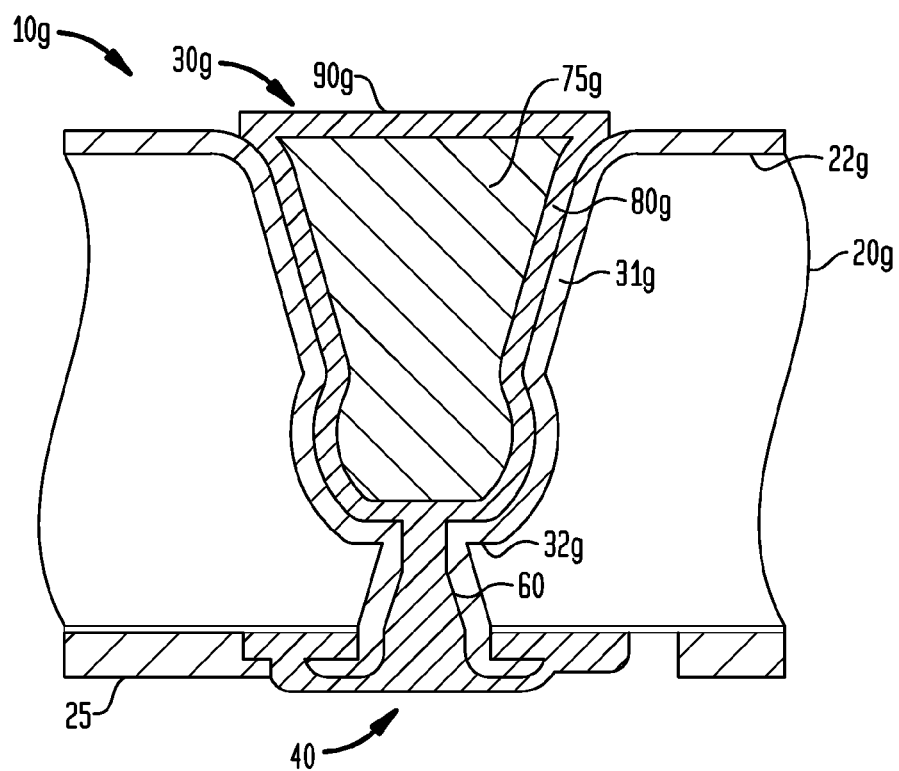
FIG. 11 is a sectional view illustrating a via structure in accordance with another embodiment.

The opening 30 extends from the rear surface 22 partially through the semiconductor element 20 towards the front surface 21. The opening 30 includes inner surface 31 that extends from the rear surface 22 through the semiconductor element 20 at an angle between 0 and 90 degrees to the horizontal plane defined by the rear surface 22. The inner surface 31 can have a constant slope (e.g., as shown in FIG. 1) or a varying slope (e.g., as shown in FIG. 11). For example, the angle or slope of the inner surface 31 relative to the horizontal plane defined by the rear surface 22 can decrease in magnitude (i.e., become less positive or less negative) as the inner surface 31 penetrates further towards the front surface 21.

As shown in FIG. 1, the opening 30 has a width W1 at the rear surface 22 and a width W2 at the lower surface 32 that is less than the width W1 such that the opening is tapered in a direction from the rear surface towards the lower surface. In other examples, the opening can have a constant width, or the opening can be tapered in a direction from the lower surface towards the rear surface. The opening 30 may extend more than half-way from the rear surface 22 towards the front surface 21, such that a height of the opening 30 in a direction perpendicular to the rear surface 22 is greater than a height of the hole 40.

Figure 20A:
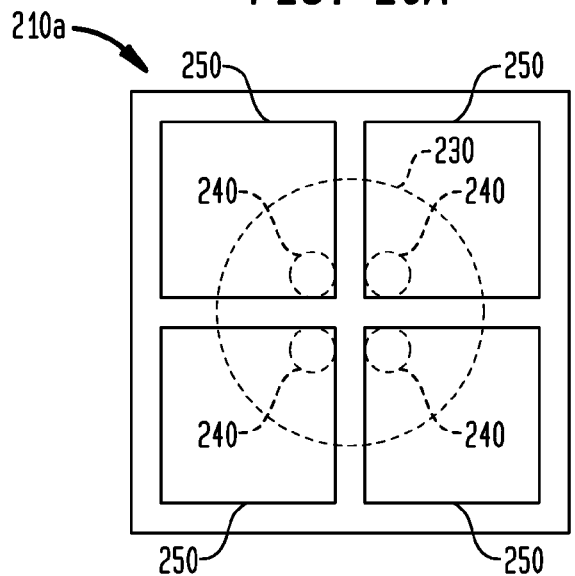
FIG. 20A is a corresponding top-down plan view illustrating a via structure in accordance with the embodiment of the invention depicted in FIG. 19.
Figure 20B:
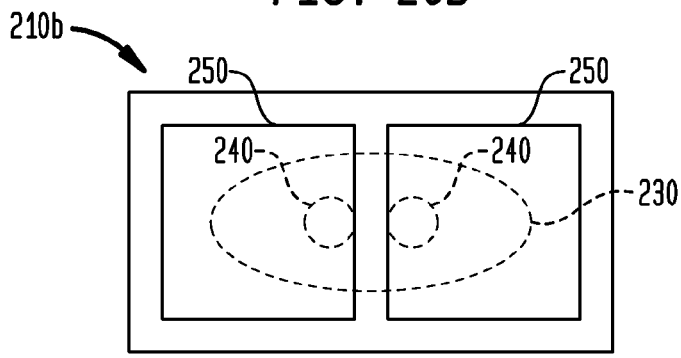
FIG. 20B is an alternate corresponding top-down plan view illustrating a via structure in accordance with the embodiment of the invention depicted in FIG. 19.
Figure 20C:
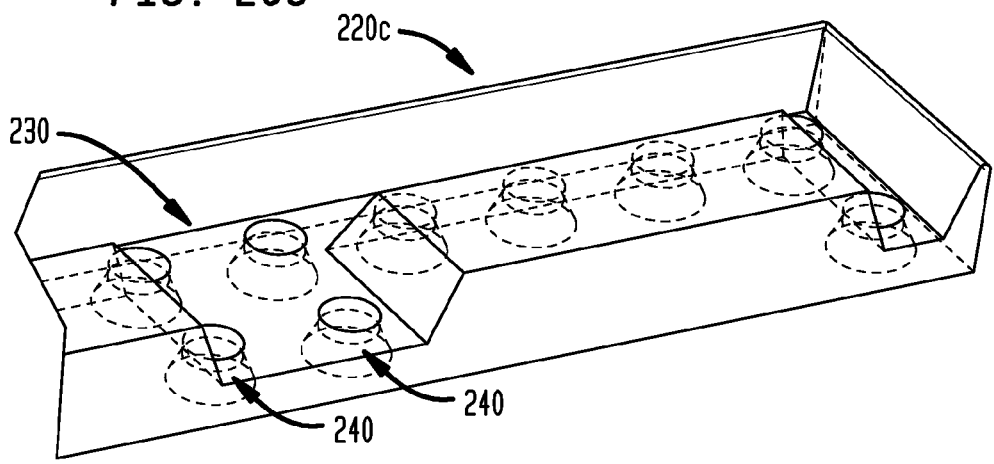
FIG. 20C is a perspective view illustrating a via structure including a channel-shaped opening coupled to a plurality of smaller openings in accordance with another embodiment.

The opening 30 can have any top-view shape, including for example, a rectangular channel with a plurality of holes extending therefrom, as shown in FIG. 20C. In one embodiment, such as in the embodiment shown in FIG. 20A, the opening can have a round top-view shape (in FIG. 20A, the opening has a frusto-conical three-dimensional shape). In the embodiment shown in FIG. 20C, the opening has a width in a first lateral direction along the rear surface, and the opening has a length in a second lateral direction along the rear surface transverse to the first lateral direction, the length being greater than the width. In some examples, the opening can have any three-dimensional shape, including for example, a cylinder, a cube, or a prism, among others.

The hole 40 can extend from a top surface 51 of the conductive pad 50 (i.e., an outwardly facing surface facing away from the semiconductor element 20), through the conductive pad to the opening 30. As shown in FIG. 1, the hole 40 has a width W3 at the lower surface 32 of the opening 30 and a width W4 at the top surface 51 of the conductive pad 50 that is greater than the width W3 such that the hole is tapered in a direction from the top surface of the conductive pad towards the opening. In other examples, the hole can have a constant width, or the hole can be tapered in a direction from the opening towards the top surface 51 of the conductive pad 50.

The inner surface 41 can have a constant slope or a varying slope. For example, the angle or slope of the inner surface 41 relative to the horizontal plane defined by the front surface 21 can decrease in magnitude (i.e., become less positive or less negative) as the inner surface 41 penetrates further from the top surface 51 of the conductive pad 50 towards the rear surface 22. The hole 40 can extend less than half-way from the top surface 51 of the conductive pad 50 towards the front surface 21, such that a height of the hole in a direction perpendicular to the front surface 21 is less than a height of the opening 30.

The hole 40 can have any top-view shape, including for example, a round shape, as shown in FIGS. 20A-20C (in FIG. 20C, the hole has a frusto-conical three-dimensional shape). In some embodiments, the hole 40 can have a square, rectangular, oval, or any other top-view shape. In some examples, the hole 40 can have any three-dimensional shape, including for example, a cylinder, a cube, or a prism, among others.

Any number of holes 40 can extend from a single opening 30, and the holes 40 can be arranged in any geometric configuration within a single opening 30. In one embodiment, such as in the embodiment shown in FIG. 20A, there can be four holes arranged in a cluster. In another embodiment, such as in the embodiment shown in FIG. 20C, there can be a plurality of holes extending from a single channel-shaped opening extending along multiple axes. Particular examples of various opening and hole configurations and methods of forming these configurations are described in the herein incorporated commonly owned U.S. Patent Application Publication No. 2008/0246136, and U.S. patent application Ser. No. 12/842,717, filed on Jul. 23, 2010.

The semiconductor element 20 includes one or more conductive pads 50 exposed at or located at the front surface 21 of the semiconductor element 20. While not specifically shown in FIG. 1, the active semiconductor devices in the active semiconductor region 23 typically are conductively connected to the conductive pads 50. The active semiconductor devices, thus, are accessible conductively through wiring incorporated extending within or above one or more dielectric layers of the semiconductor element 20.

In some embodiments, the conductive pads may not be directly exposed at the front surface of the semiconductor element. Instead, the conductive pads may be electrically connected to traces or other conductive elements extending to terminals that are exposed at the front surface of the semiconductor element. The conductive pads 50 can be made from any electrically conductive metal, including for example, copper or gold. The conductive pads 50 and any of the conductive pads disclosed herein can have any top-view shape, including a square, round, oval, triangle, rectangle, or any other shape.

As used in this disclosure, a statement that an electrically conductive element is "exposed at" a surface of a dielectric element indicates that the electrically conductive element is available for contact with a theoretical point moving in a direction perpendicular to the surface of the dielectric element toward the surface of the dielectric element from outside the dielectric element. Thus, a terminal or other conductive element which is exposed at a surface of a dielectric element may project from such surface; may be flush with such surface; or may be recessed relative to such surface and exposed through a hole or depression in the dielectric.

While essentially any technique usable for forming conductive elements can be used to form the conductive elements described herein, non-lithographic techniques as discussed in greater detail in the co-pending U.S. patent application Ser. No. 12/842,669, filed on Jul. 23, 2010, can be employed. Such non-lithographic techniques can include, for example, selectively treating a surface with a laser or with mechanical processes such as milling or sandblasting so as to treat those portions of the surface along the path where the conductive element is to be formed differently than other portions of the surface. For example, a laser or mechanical process may be used to ablate or remove a material such as a sacrificial layer from the surface only along a particular path and thus form a groove extending along the path. A material such as a catalyst can then be deposited in the groove, and one or more metallic layers can be deposited in the groove.

The conductive via 60 extends within the hole 40 and is electrically connected with the conductive pad 50 and the conductive interconnect 80. As shown, the conductive via 60 extends through the conductive pad 50 and partially overlies and contacts the top surface 51 thereof.

As shown in FIG. 1, the conductive via 60 can fill all of the volume within the hole 40 inside of a dielectric layer 25 that electrically insulates the semiconductor element 20 from the conductive via. In other words, a second aperture 74 extending within the dielectric layer 25 within the hole 40 conforms to a contour of the hole, and the conductive via 60 conforms to the contour of the hole. As shown in FIG. 1, the dielectric layer 25 contacts an interior surface 53 of the conductive pad 50 exposed within the hole 40, and the dielectric layer extends out of the hole and contacts the top surface 51 of the conductive pad.

Figure 2:
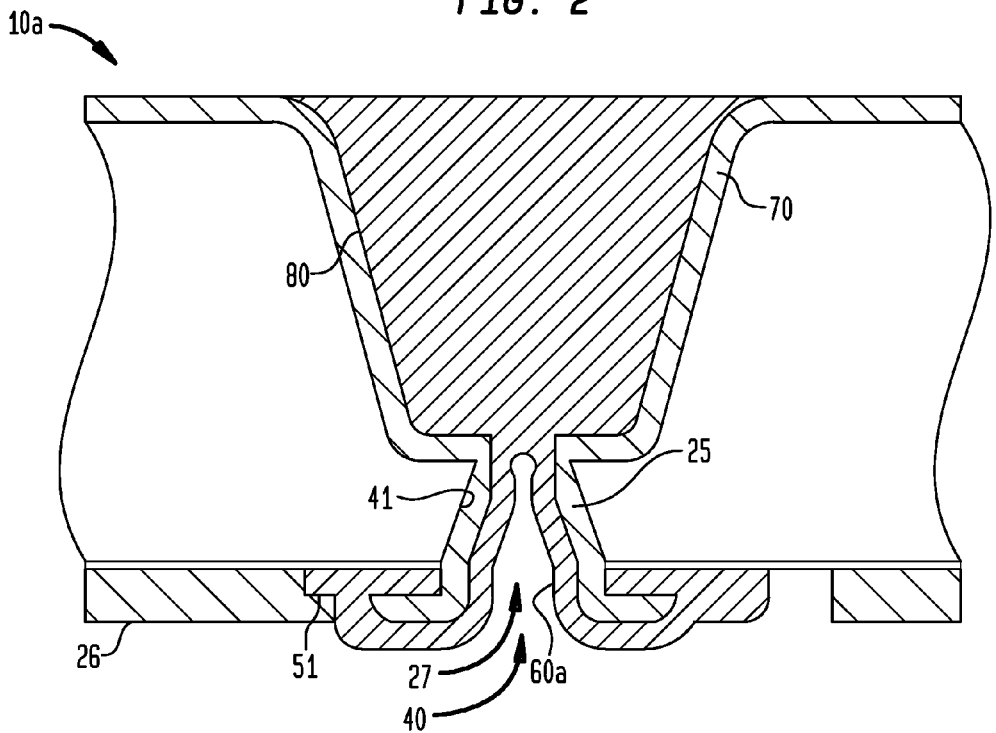
FIG. 2 is a sectional view illustrating a via structure in accordance with another embodiment.

As shown in FIG. 1, the conductive via 60 is solid. In other embodiments (e.g., as shown in FIG. 2), the conductive interconnect can include an internal space that can be left open, filled with a dielectric material, or filled with a second conductive material.

Figure 17:
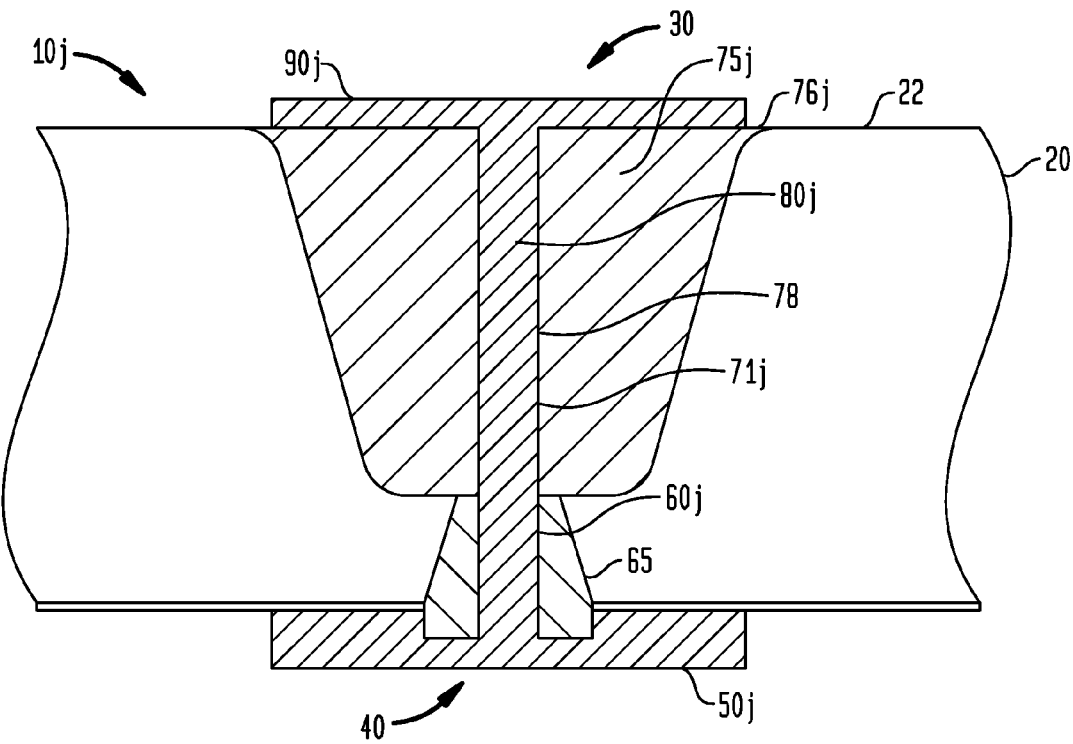
FIG. 17 is a sectional view illustrating a via structure in accordance with another embodiment.

In other embodiments, such as that shown in FIG. 17, the conductive via portion of a conductive interconnect that is located within the hole may have a cylindrical or frusto-conical shape. The conductive via 60 can be made from a metal or an electrically conductive compound of a metal, including for example, copper or gold.

The conductive interconnect 80 extends within the opening 30 and is electrically connected with the conductive via 60. As shown in FIG. 1, the conductive interconnect 80 can fill all of the volume within the opening 30 inside of a dielectric layer 70 that electrically insulates the semiconductor element 20 from the conductive interconnect. In other words, a first aperture 71 extending within the dielectric layer 70 within the opening 30 conforms to a contour of the opening, and the conductive interconnect 80 conforms to the contour of the opening.

In a particular embodiment (and in all of the other embodiments described herein), the width W2 of the conductive interconnect 80 at the lower surface 32 is different from the width W3 of the conductive via 60 at a top end thereof where the conductive interconnect and the conductive via meet.

Figure 5:
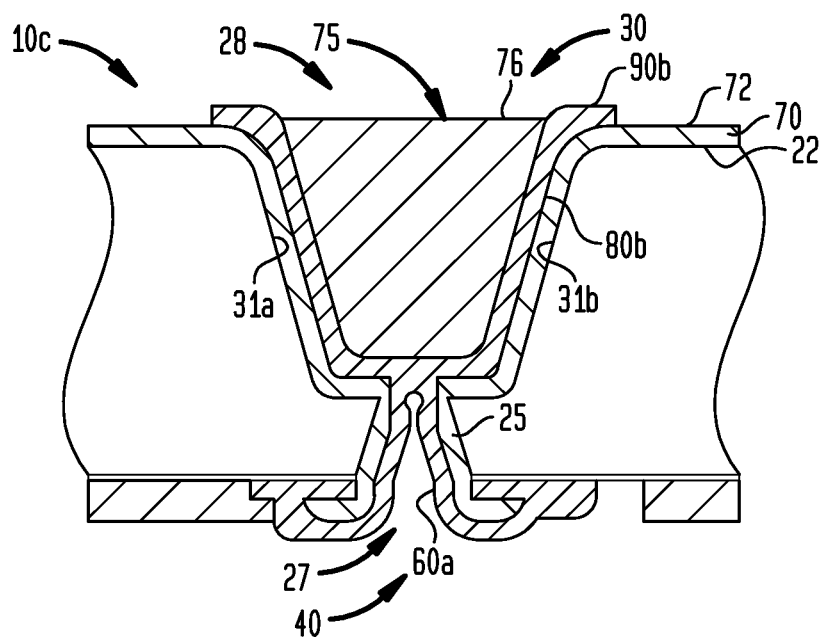
FIG. 5 is a sectional view illustrating a via structure in accordance with another embodiment.

As shown in FIG. 1, the conductive interconnect 80 is solid. In other embodiments (e.g., as shown in FIG. 5), the conductive interconnect can include an internal space that can be left open, filled with a dielectric material, or filled with a second conductive material.

In other embodiments, such as that shown in FIG. 17, the conductive interconnect portion of a single unitary conductive interconnect that is located within the opening may have a cylindrical or frusto-conical shape. The conductive interconnect 80 can be made from any electrically conductive metal, including for example, copper or gold.

A surface 90 of the conductive interconnect 80 is exposed at the outer surface 72 of the dielectric layer 70 for interconnection to an external element. In one embodiment, the exposed surface 90 can be the top surface of the interconnect 80, i.e., a surface at a furthest extent of the pad from the via or the exposed surface may not be a top surface thereof. As shown, the surface 90 is located at the plane defined by the outer surface 72 of the dielectric layer 70 and above the plane defined by the rear surface 22 of the semiconductor element 20. In other embodiments, the surface 90 of the conductive interconnect 80 can be located above or below the plane defined by the outer surface 72 of the dielectric layer 70, and/or the surface 90 can be located at or below the plane defined by the rear surface 22. The surface 90 of the conductive interconnect 80 can be planarized to the outer surface 72 of the dielectric layer 70 or the rear surface 22, for example, by a grinding, lapping, or polishing process.

In some embodiments (e.g., the stacked embodiment shown in FIG. 10), conductive bond material can be exposed at the surface 90 or at a surface of another conductive contact exposed at the rear surface of the semiconductor element for interconnection with an external device.

FIG. 2 is a sectional view illustrating a variation of the via structure of FIG. 1 having an alternate conductive via configuration. The microelectronic unit 10a is similar to the microelectronic unit 10 described above, but rather than having a conductive via that fully fills the space inside of the hole 40 that is not occupied by the dielectric layer 25, the conductive via 60a is deposited as a metallic layer onto the dielectric layer, such that an internal space 27 is created inside the conductive via 60a.

Figure 3A:
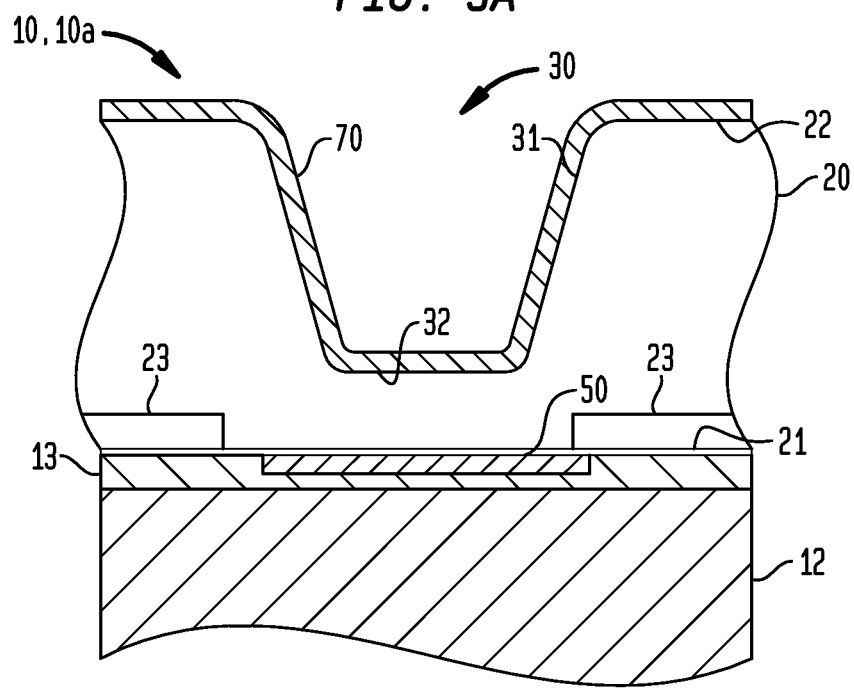
FIGS. 3A-3F are sectional views illustrating stages of fabrication in accordance with the embodiments of the invention depicted in FIGS. 1 and 2.

A method of fabricating the microelectronic unit 10 or 10a (FIGS. 1 and 2) will now be described, with reference to FIGS. 3A-3F. As illustrated in FIG. 3A, the microelectronic unit 10 or 10a has one or more active semiconductor regions 23 and one or more conductive pads 50. The opening 30 can be formed extending downwardly from the rear surface 22 towards the front surface 21 of the semiconductor element 20. The opening 30 can be formed for example, by selectively etching the semiconductor element 20, after forming a mask layer where it is desired to preserve remaining portions of the rear surface 22. For example, a photoimageable layer, e.g., a photoresist layer, can be deposited and patterned to cover only portions of the rear surface 22, after which a timed etch process can be conducted to form the opening 30. A support wafer 12 is temporarily attached to the front surface 21 of the semiconductor element 20 by an adhesive layer 13 to provide additional structural support to the semiconductor element during processing of the rear surface 22.

Each opening 30 has a lower surface 32 which is flat and typically equidistant from the front surface 21. The inner surfaces 31 of the opening 30, extending downwardly from the rear surface 22 towards the lower surface 32, may be sloped, i.e., may extend at angles other a normal angle (right angle) to the rear surface 22, as shown in FIG. 3A. Wet etching processes, e.g., isotropic etching processes and sawing using a tapered blade, among others, can be used to form openings 30 having sloped inner surfaces 31. Laser dicing, mechanical milling, chemical etching, laser drilling, plasma etching, directing a jet of fine abrasive particles towards the semiconductor element 20, among others, can also be used to form openings 30 (or any other hole or opening described herein) having sloped inner surfaces 31.

Alternatively, instead of being sloped, the inner surfaces of the opening 30 may extend in a vertical or substantially vertical direction downwardly from the rear surface 22 substantially at right angles to the rear surface 22. Anisotropic etching processes, laser dicing, laser drilling, mechanical removal processes, e.g., sawing, milling, ultrasonic machining, directing a jet of fine abrasive particles towards the semiconductor element 20, among others, can be used to form openings 30 having essentially vertical inner surfaces.

In a particular embodiment (not shown), the opening 30 can be located over a plurality of conductive pads 50 located on more than one microelectronic unit 10, such that when the microelectronic units 10 are severed from each other, a portion of the opening 30 will be located on each microelectronic unit 10. As used herein in the specification and in the claims, the term "opening" can refer to a opening that is located entirely within a single microelectronic unit (e.g., as shown in FIGS. 20A and 20B), an opening that extends across a plurality of microelectronic units 10 when it is formed (not shown), or a portion of an opening that is located on a particular microelectronic unit 10 after it is severed from other microelectronic units 10.

After forming the opening 30 in the semiconductor element 20, a photoimageable layer such as a photoresist or a dielectric layer 70 can be deposited onto the rear surface 22 of the semiconductor element. Various methods can be used to form the dielectric layer 70. In one example, a flowable dielectric material is applied to the rear surface 22 of the semiconductor element 20, and the flowable material is then more evenly distributed across the rear surface during a "spin-coating" operation, followed by a drying cycle which may include heating. In another example, a thermoplastic film of dielectric material can be applied to the rear surface 22 of the semiconductor element 20 after which the semiconductor element is heated, or is heated in a vacuum environment, i.e., placed in an environment under lower than ambient pressure. This then causes the film to flow downward onto the inner surfaces 31 and the lower surfaces 32 of the opening 30. In another example, vapor deposition can be used to form the dielectric layer 70.

In still another example, the semiconductor element 20 can be immersed in a dielectric deposition bath to form a conformal dielectric coating or dielectric layer 70. As used herein, a "conformal coating" is a coating of a particular material that conforms to a contour of the surface being coated, such as when the dielectric layer 70 conforms to a contour of the opening 30 of the semiconductor element 20. An electrochemical deposition method can be used to form the conformal dielectric layer 70, including for example, electrophoretic deposition or electrolytic deposition.

In one example, an electrophoretic deposition technique can be used to form the conformal dielectric coating, such that the conformal dielectric coating is only deposited onto exposed conductive and semiconductive surfaces of the assembly. During deposition, the semiconductor device wafer is held at a desired electric potential and an electrode is immersed into the bath to hold the bath at a different desired potential. The assembly is then held in the bath under appropriate conditions for a sufficient time to form an electrodeposited conformal dielectric layer 70 on exposed surfaces of the device wafer which are conductive or semiconductive, including but not limited to along the rear surface 22 and the inner surfaces 31 and lower surface 32 of the opening 30. Electrophoretic deposition occurs so long as a sufficiently strong electric field is maintained between the surface to be coated thereby and the bath. As the electrophoretically deposited coating is self-limiting in that after it reaches a certain thickness governed by parameters, e.g., voltage, concentration, etc. of its deposition, deposition stops.

Electrophoretic deposition forms a continuous and uniformly thick conformal coating on conductive and/or semiconductive exterior surfaces of the assembly. In addition, the electrophoretic coating can be deposited so that it does not form on pre-existing dielectric layers, due to its dielectric (nonconductive) property. Stated another way, a property of electrophoretic deposition is that is does not form on a layer of dielectric material overlying a conductor provided that the layer of dielectric material has sufficient thickness, given its dielectric properties. Typically, electrophoretic deposition will not occur on dielectric layers having thicknesses greater than about 10 microns to a few tens of microns. The conformal dielectric layer 70 can be formed from a cathodic epoxy deposition precursor. Alternatively, a polyurethane or acrylic deposition precursor could be used. A variety of electrophoretic coating precursor compositions and sources of supply are listed in Table 1 below.

TABLE 1

| ECOAT NAME | POWERCRON 645 | POWERCRON 648 | CATHOGUARD 325 |
|---|---|---|---|
| MANUFACTURERS | | | |
| MFG | PPG | PPG | BASF |
| TYPE | CATHODIC | CATHODIC | CATHODIC |
| POLYMER BASE | EPOXY | EPOXY | EPOXY |
| LOCATION | Pittsburgh, PA | Pittsburgh, PA | Southfield, MI |
| APPLICATION DATA | | | |
| Pb/Pf-free | Pb-free | Pb or Pf-free | Pb-free |
| HAPs, g/L | | 60-84 | COMPLIANT |
| VOC, g/L (MINUS WATER) | | 60-84 | <95 |
| CURE | 20 min/175 C. | 20 min/175 C. | |
| FILM PROPERTIES | | | |
| COLOR | Black | Black | Black |
| THICKNESS, μm | 10-35 | 10-38 | 13-36 |
| PENCIL HARDNESS | | 2H+ | 4H |
| BATH CHARACTERISTICS | | | |
| SOLIDS, % wt. | 20 (18-22) | 20 (19-21) | 17.0-21.0 |
| pH (25 C.) | 5.9 (5.8-6.2) | 5.8 (5.6-5.9) | 5.4-6.0 |
| CONDUCTIVITY (25 C.) μS | 1000-1500 | 1200-1500 | 1000-1700 |
| P/B RATIO | 0.12-0.14 | 0.12-0.16 | 0.15-0.20 |
| OPERATION TEMP., C. | 30-34 | 34 | 29-35 |
| TIME, sec | 120-180 | 60-180 | 120+ |
| ANODE | SS316 | SS316 | SS316 |
| VOLTS | | 200-400 | >100 |

| ECOAT NAME | ELECTROLAC | LECTRASEAL DV494 | LECTROBASE 101 |
|---|---|---|---|
| MANUFACTURERS | | | |
| MFG | MACDERMID | LVH COATINGS | LVH COATINGS |
| TYPE | CATHODIC | ANODIC | CATHODIC |
| POLYMER BASE | POLYURETHANE | URETHANE | URETHANE |
| LOCATION | Waterbury, CT | Birmingham, UK | Birmingham, UK |
| APPLICATION DATA | | | |
| Pb/Pf-free | | Pb-free | Pb-free |
| HAPs, g/L | | | |
| VOC, g/L (MINUS WATER) | | | |
| CURE | 20 min/149 C. | 20 min/175 C. | 20 min/175 C. |
| FILM PROPERTIES | | | |
| COLOR | Clear (+dyed) | Black | Black |
| THICKNESS, μm | | 10-35 | 10-35 |
| PENCIL HARDNESS | 4H | | |
| BATH CHARACTERISTICS | | | |
| SOLIDS, % wt. | 7.0 (6.5-8.0) | 10-12 | 9-11 |
| pH (25 C.) | 5.5-5.9 | 7-9 | 4.3 |
| CONDUCTIVITY (25 C.) μS | 450-600 | 500-800 | 400-800 |
| P/B RATIO | | | |
| OPERATION TEMP., C. | 27-32 | 23-28 | 23-28 |
| TIME, sec | | | 60-120 |
| ANODE | SS316 | 316SS | 316SS |
| VOLTS | 40, max | | 50-150 |

In another example, the dielectric layer can be formed electrolytically. This process is similar to electrophoretic deposition, except that the thickness of the deposited layer is not limited by proximity to the conductive or semiconductive surface from which it is formed. In this way, an electrolytically deposited dielectric layer can be formed to a thickness that is selected based on requirements, and processing time is a factor in the thickness achieved.

Figure 3B:
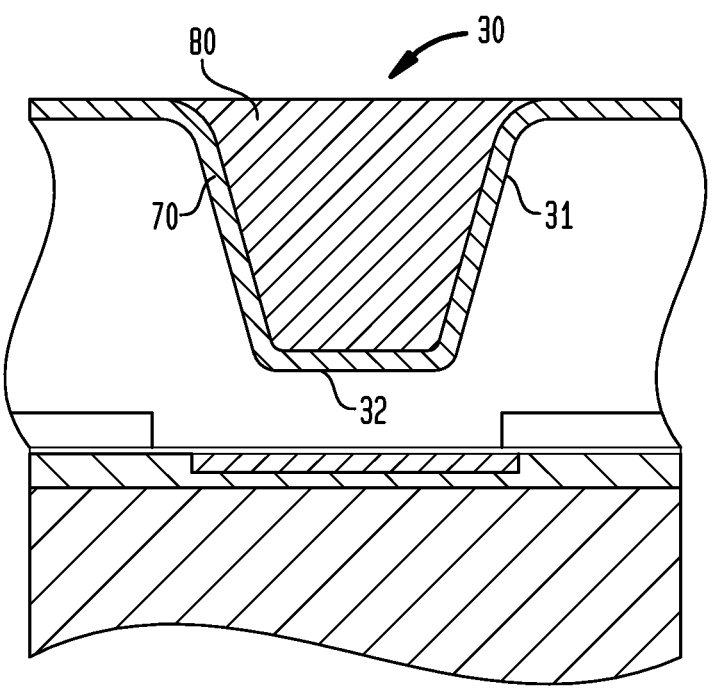

Thereafter, as illustrated in FIG. 3B, the conductive interconnect 80 is deposited into the opening 30 overlying the portion of the dielectric layer 70 that is located within the opening, such that the shape of the conductive interconnect 80 conforms to a contour of the inner surfaces 31 and the lower surface 32. To form the conductive interconnect 80, an exemplary method involves depositing a metal layer by one or more of sputtering a primary metal layer onto the outer surface 72 of the dielectric layer 70, plating, or mechanical deposition. Mechanical deposition can involve the directing a stream of heated metal particles at high speed onto the surface to be coated. This step can be performed by blanket deposition onto the rear surface 22, the inner surfaces 31 and the lower surfaces 32 of the opening 30, for example. In one embodiment, the primary metal layer includes or consists essentially of aluminum. In another particular embodiment, the primary metal layer includes or consists essentially of copper. In yet another embodiment, the primary metal layer includes or consists essentially of titanium. One or more other exemplary metals can be used in a process to form the conductive interconnect 80. In particular examples, a stack including a plurality of metal layers can be formed on one or more of the afore-mentioned surfaces. For example, such stacked metal layers can include a layer of titanium followed by a layer of copper overlying the titanium (Ti—Cu), a layer of nickel followed by a layer of copper overlying the nickel layer (Ni—Cu), a stack of nickel-titanium-copper (Ni—Ti—Cu) provided in similar manner, or a stack of nickel-vanadium (Ni—V), for example.

The conductive interconnect 80 is insulated from the semiconductor element 20 by the dielectric layer 70. As shown in FIG. 3B, the conductive interconnect 80 is solid. In other embodiments (e.g., FIGS. 4 and 5), the conductive interconnect 80 can include an internal space that is filled with a second conductive material or a dielectric material.

Figure 3C:
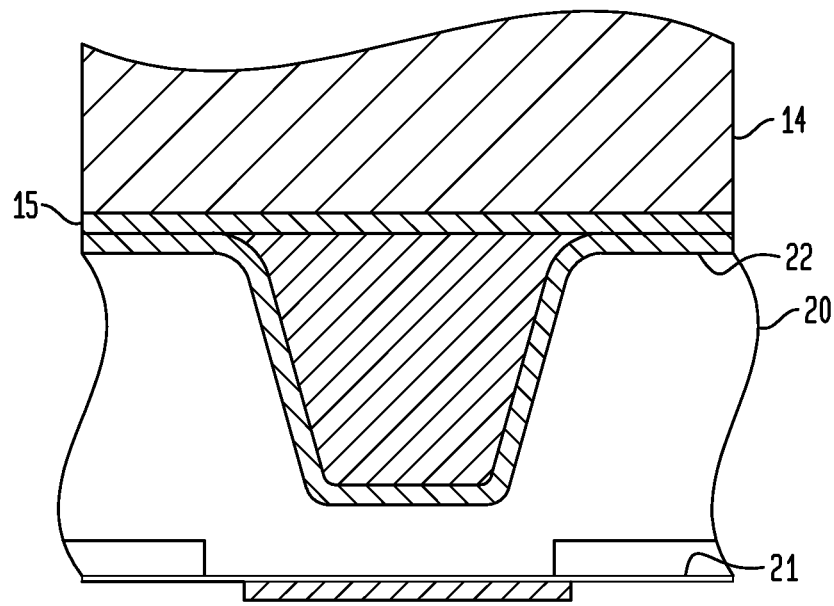

Thereafter, as illustrated in FIG. 3C, the support wafer 12 is removed from the front surface 21 of the semiconductor element 20, and a support wafer 14 is temporarily attached to the rear surface 22 of the semiconductor element 20 by an adhesive layer 15 to provide additional structural support to the semiconductor element during processing of the front surface.

Figure 3D:
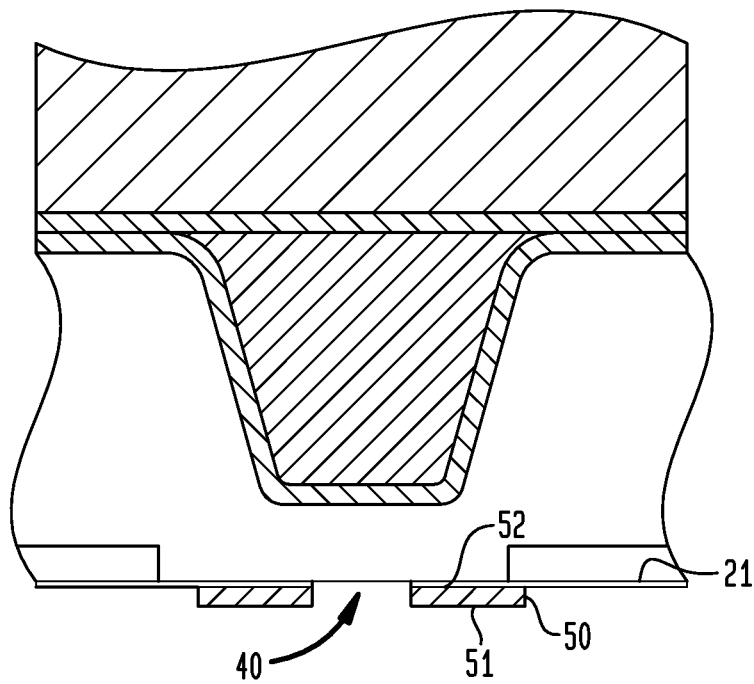

Thereafter, as illustrated in FIG. 3D, a mask layer (not shown) can be deposited onto the front surface 21 and the conductive pad 50 where it is desired to preserve remaining portions of the front surface and the conductive pad. For example, a photoimageable layer, e.g., a photoresist layer, can be deposited and patterned to cover only portions of the front surface 21 and the conductive pad 50. Then, an etch process can be applied to the portion of the conductive pad 50 exposed within the mask openings so as to remove the metal of the conductive pad underlying the mask opening. As a result, a hole 40 is formed that extends through the conductive pad 50 from the top surface 51 to the bottom surface 52 thereof.

Figure 3E:
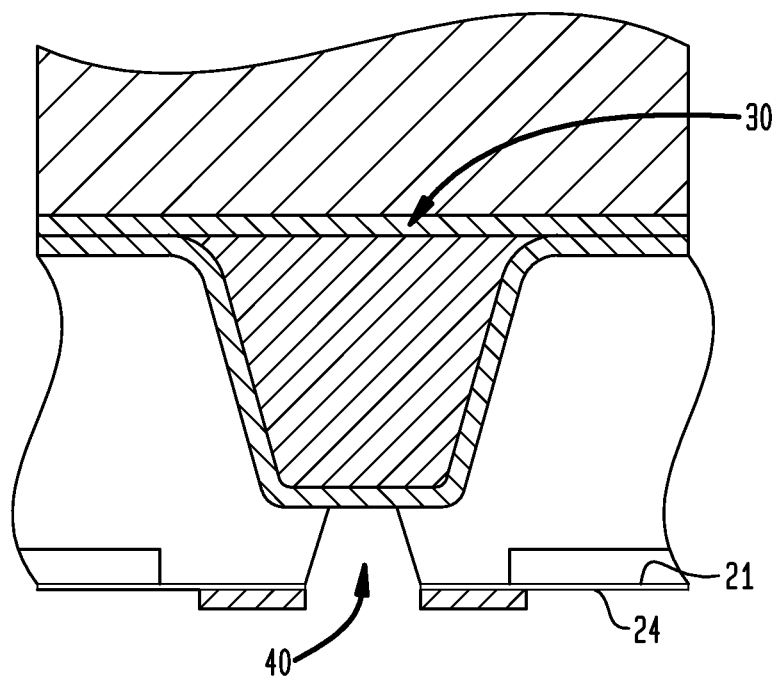

Thereafter, as illustrated in FIG. 3E, another etch process can be conducted in a manner that selectively etches the semiconductor material, e.g., silicon, thereby extending the hole 40 into the semiconductor element from the front surface 21 to the opening 30. A portion of the passivation layer 24 is also removed during the formation of the hole 40, and such portion can be etched through during the etching of the conductive pad 50, during etching of the semiconductor element 20, or as a separate etching step. Etching, laser drilling, mechanical milling, or other appropriate techniques can be used to remove the portion of the passivation layer 24. In a particular embodiment, the process steps illustrated in FIGS. 3D and 3E can be combined into a single process step. For example, when forming the hole 40, a laser can be used to drill through the conductive pad 50, a portion of the passivation layer 24, and a portion of the semiconductor element 20 in a single process step. This combination of process steps for creating the hole 40 can be used in any of the embodiments described herein.

Other possible dielectric layer removal techniques include various selective etching techniques which can be isotropic or anisotropic in nature. Anisotropic etch processes include reactive ion etch processes in which a stream of ions are directed towards surfaces to be etched. Reactive ion etch processes are generally less selective than isotropic etch processes such that surfaces at which ions strike at high angles of incidence are etched to a greater extent than surfaces which are oriented with the stream of ions. When a reactive ion etch process is used, desirably, a mask layer is desirably deposited to overlie the passivation layer 24 and an opening is formed therein which is aligned with the hole 40. In such a way, the etch process avoids removing portions of the passivation layer 24 other than that which lies within the hole 40.

Figure 3F:
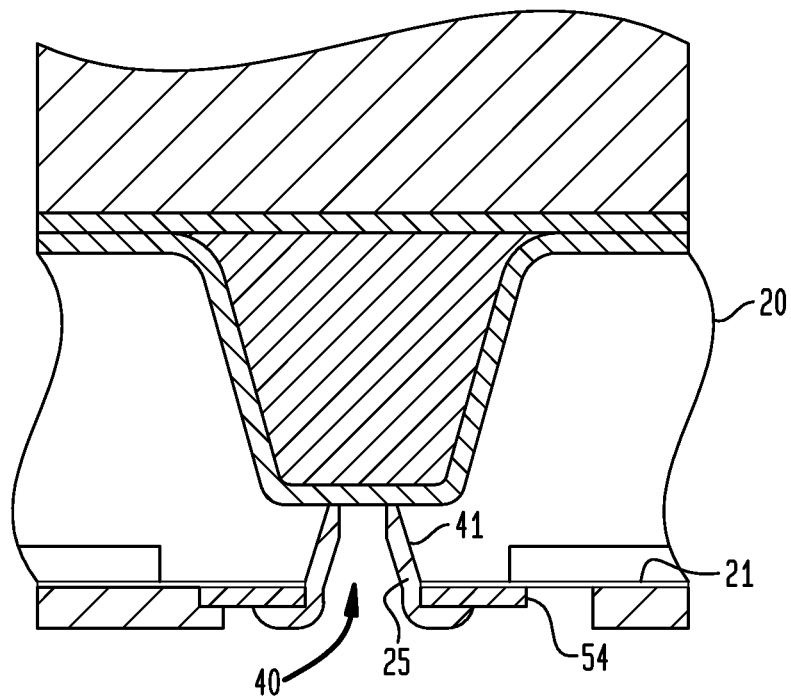

Thereafter, as illustrated in FIG. 3F, a photoimageable layer such as a photoresist or a dielectric layer 25 can be deposited onto the front surface 21 of the semiconductor element 20 where it is desired to electrically insulate portions of the front surface and the inner surface 41 of the hole 40 from the conductive via that will be deposited in the following step.

Thereafter, referring again to FIGS. 1 and 2, an etch process can be applied to the portion of the dielectric layer 70 that is exposed within the hole 40 so as to expose the portion of the conductive interconnect 80 that is aligned with the hole. Then, the conductive via 60 or 60a is deposited into the hole 40 overlying the portion of the dielectric layer 25 that is located within the hole, for example, by blanket deposition, such that the shape of the conductive via 60 conforms to respective contours of the inner surface 41 of the hole, the exposed surface of the conductive pad 50, and an outer surface 26 of the dielectric layer. The conductive via 60 or 60a extends from the exposed portion of the conductive interconnect 80 to exposed portions of the top surface 51 and lateral surface 54 (visible in FIG. 3F) of the conductive pad 50.

As shown in FIG. 1, the conductive via 60 can be formed by continuing the metal deposition process until the conductive via becomes solid, such that there is no open space inside of the conductive via. As shown in FIG. 2, the conductive via 60a can be formed by stopping the metal deposition process before the conductive via becomes solid, such that the internal space 27 is created inside the conductive via. After formation of the conductive via 60 or 60a, the support wafer 14 is removed from the rear surface 22 of the semiconductor element 20.

Finally, if a plurality of microelectronic units 10 or 10a are formed together on a single wafer (not shown), the microelectronic units can be severed from each other along dicing lanes by sawing or other dicing method to form individual microelectronic units. A variety of exemplary processes for severing device wafers into individual units are described in the herein incorporated commonly owned U.S. Provisional Application Nos. 60/761,171 and 60/775,086, any of which can be used to sever the device wafers to form individual microelectronic units.

Figure 4:
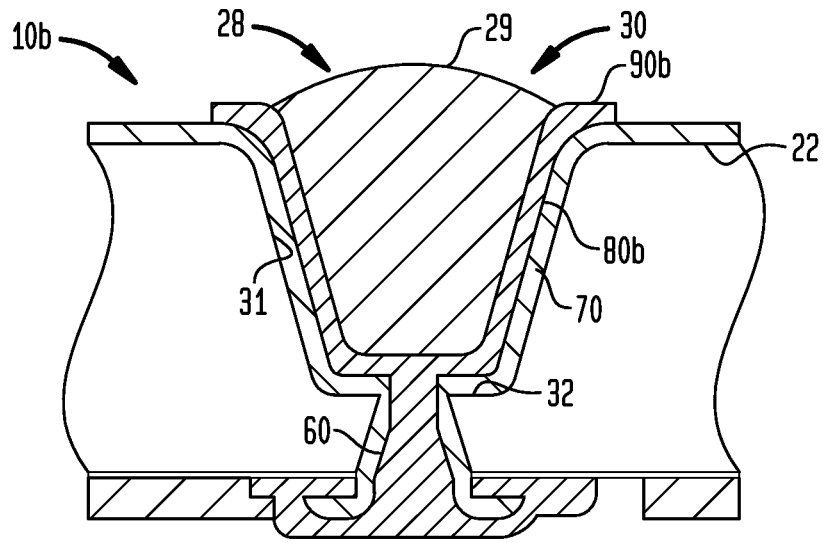
FIG. 4 is a sectional view illustrating a via structure in accordance with another embodiment.

FIG. 4 is a sectional view illustrating a variation of the via structure of FIG. 1 having an alternate conductive interconnect configuration. The microelectronic unit 10b is similar to the microelectronic unit 10 described above, but rather than having a conductive interconnect that fills the space inside of the opening that is not occupied by the dielectric layer, the conductive interconnect 80b is deposited into the opening 30 as a metallic layer onto the dielectric layer 70. The conductive interconnect 80b is conformal to a contour of the inner surfaces 31 and the lower surface 32 of the opening 30, although the conductive interconnect is separated from the inner surfaces 31 and the lower surface 32 by the dielectric layer 70.

An internal space 28 is created inside the conductive interconnect 80b that is filled with a conductive mass 29, such as solder, that is exposed at the rear surface 22 for interconnection to an external device. The conductive interconnect 80b can include a contact surface 90b that extends out of the opening 30 onto the rear surface 22, and the contact surface can serve as a contact for electrical connection with an external device.

In a particular embodiment, the conductive interconnect 80b can coat the entire outer surface 72 of the dielectric layer 70 that is located within the opening 30. Alternatively, the conductive interconnect 80b can coat a portion (e.g., half) of the outer surface 72 of the dielectric layer 70 that is located within the opening 30.

The conductive mass 29 can comprise a fusible metal having a relatively low melting temperature, e.g., solder, tin, or a eutectic mixture including a plurality of metals. Alternatively, the conductive mass 29 can include a wettable metal, e.g., copper or other noble metal or non-noble metal having a melting temperature higher than that of solder or another fusible metal. Such wettable metal can be joined with a corresponding feature, e.g., a fusible metal feature of an interconnect element such as a circuit panel to externally interconnect the microelectronic unit 10b to such interconnect element. In a particular embodiment, the conductive mass 29 can include a conductive material interspersed in a medium, e.g., a conductive paste, e.g., metal-filled paste, solder-filled paste or isotropic conductive adhesive or anisotropic conductive adhesive.

FIG. 5 is a sectional view illustrating a variation of the via structure of FIG. 4 having an alternate conductive interconnect configuration. The microelectronic unit 10c is similar to the microelectronic unit 10b described above, but rather than having a internal space inside the conductive interconnect that is filled with a conductive mass, the internal space 28 is filled with a dielectric region 75. Also, rather than having a conductive via that fully fills the space inside of the hole 40 that is not occupied by the dielectric layer 25, the microelectronic unit 10c includes the conductive via 60a having an internal space 27 that is shown in FIG. 2.

The dielectric region 75 can provide good dielectric isolation with respect to the conductive interconnect 80b. The dielectric region 75 can be compliant, having a sufficiently low modulus of elasticity and sufficient thickness such that the product of the modulus and the thickness provide compliancy.

As shown in FIG. 5, the dielectric region 75 can fill the remainder of the opening 30 that is not occupied by the conductive interconnects 80b or the dielectric layer 70, such that an outer surface 76 extends above but is parallel to a plane defined by the rear surface 22 of the semiconductor element 20. The outer surface 76 is also located above a plane defined by the outer surface 72 of the dielectric layer 70, and the outer surface 76 is located below a plane defined by the contact surface 90b of the conductive interconnect 80b. In particular embodiments, the outer surface 76 of the dielectric region 75 can be located at or below the planes defined by the rear surface 22 and the outer surface 72, and the outer surface can be located at or above the plane defined by the contact surface 90b.

In another embodiment, there can be a plurality of conductive interconnects 80b extending from the conductive via 60 along the inner surfaces 31 to the rear surface 22. For example, there can be four conductive interconnects 80b, each conductive interconnect spaced at 90° intervals about a frusto-conical inner surface 31, and each conductive interconnect having a contact surface 90b exposed at the rear surface 22 and that can serve as a contact for electrical connection with an external device. Each conductive interconnect 80b can be insulated from each of the other conductive interconnects by the dielectric region 75.

In an example embodiment, wherein the opening has a channel shape (e.g., as shown in FIG. 20C), spaced-apart conductive interconnects 80b can alternately extend along a first inner surface 31a defining a first side of the channel-shaped opening and a second inner surface 31b defining a second side of the opening, each conductive interconnect 80b extending from a respective conductive via 60a.

FIG. 6 is a sectional view illustrating a variation of the via structure of FIG. 1 having an alternate conductive interconnect configuration. The microelectronic unit 10d is similar to the microelectronic unit 10 described above, but rather than having a conductive interconnect that fills the space inside of the opening that is not occupied by the dielectric layer, the conductive interconnect 80d is deposited into a first aperture 71 formed in a dielectric region 75d located within the opening 30.

The conductive interconnect 80d is not conformal to either a contour of the inner surfaces 31 or a contour of the lower surface 32 of the opening 30. The microelectronic unit 10d further includes a conductive contact 90d electrically connected to the conductive interconnect 80d. The conductive contact 90d can overlie an inner surface 31 of the opening 30 and may wholly overlie the inner surface 31 or the lower surface 32 or both.

The dielectric region 75d can provide good dielectric isolation with respect to the conductive interconnect 80d. The dielectric region 75d can be compliant, having a sufficiently low modulus of elasticity and sufficient thickness such that the product of the modulus and the thickness provide compliancy. Specifically, such a compliant dielectric region 75d can allow the conductive interconnect 80d and the conductive contact 90d attached thereto to flex or move somewhat relative to the semiconductor element 20 when an external load is applied to the conductive contact. In that way, the bond between the conductive contacts 90d of the microelectronic unit 10d and terminals of a circuit panel (not shown) can better withstand thermal strain due to mismatch of the coefficient of thermal expansion ("CTE") between the microelectronic unit and the circuit panel.

As shown in FIG. 6, the dielectric region 75d can fill the remainder of the opening 30 that is not occupied by the conductive interconnect 80d or the dielectric layer 70, such that an outer surface 76d extends to a plane defined by the rear surface 22 of the semiconductor element 20. In particular embodiments, the outer surface 76d of the dielectric region 75d can be located above or below the plane defined by the rear surface 22.

The first aperture 71 is provided in the dielectric region 75d. The first aperture 71 has a frusto-conical shape and extends through the dielectric region 75d from a bottom surface 91 of the conductive contact 90d to the conductive via 60. In particular embodiments, the first aperture can have other shapes, including for example, a cylindrical shape (e.g., FIG. 8) or a combination of a cylindrical and a frusto-conical shape at different distances from the rear surface. In the embodiment shown, a contour of the first aperture 71 (i.e., the shape of the outer surface of the first aperture 71) does not conform to a contour of the opening 30 (i.e., the shape of the inner surface 31 of the opening 30).

In a particular embodiment, the conductive interconnect 80d and the conductive via 60 can have different widths at the point where they are joined to each other, such that an outer surface 81 of the conductive interconnect 80d can have a slope discontinuity at the transition point to an outer surface 61 of the conductive via 60.

The conductive interconnect 80d can be formed either solid or hollow depending upon the process conditions. Under appropriate process conditions, a conductive interconnect that includes an internal space can be produced, and that internal space can then be filled with a dielectric material or a second conductive material, whereby the dielectric layer or the second conductive material overlies the conductive interconnect within the first aperture.

The conductive contact 90d can be aligned with the opening 30 and can be disposed wholly or partly within an area of the semiconductor element 20 defined by the opening. As seen in FIG. 6, the conductive contact 90 is wholly disposed within an area defined by the opening 30. A plane defined by an upwardly facing surface 92 of the conductive contact 90 (which typically is a top surface of the contact) is substantially parallel to the plane defined by the rear surface 22 of the semiconductor element 20.

As shown, the conductive contact 90 has the shape of a conductive bond pad, e.g., a thin flat member. In other embodiments, the conductive contact can be any other type of conductive contact, including for example, a conductive post.

As shown, the opening 30 has a first width in a lateral direction along the rear surface 22, and the conductive contact 90 has a second width in the lateral direction, the first width being greater than the second width.

A method of fabricating the microelectronic unit 10d will now be described, with reference to FIGS. 7A-7J. The microelectronic unit 10d is shown in FIGS. 7A-7J as first forming the hole from the front surface of the semiconductor element and then forming the opening from the rear surface thereof. The microelectronic unit 10d and any of the other via structures disclosed herein can be formed either by forming the hole first (e.g., as shown in FIGS. 7A-7J) or by forming the opening first (e.g., as shown in FIGS. 3A-3F).

Figure 7A:
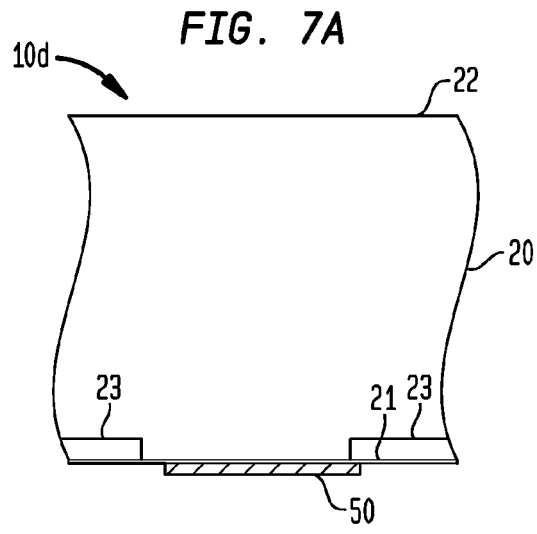
FIGS. 7A-7J are sectional views illustrating stages of fabrication in accordance with the embodiment of the invention depicted in FIG. 6.

As illustrated in FIG. 7A, the microelectronic unit 10d has one or more active semiconductor regions 23 and one or more conductive pads 50 located at the front surface 21 of the semiconductor element 20. A support wafer (such as that shown in FIGS. 3C-3F) can be temporarily attached to the rear surface 22 of the semiconductor element 20 to provide additional structural support to the semiconductor element during processing of the front surface 21.

Figure 7B:
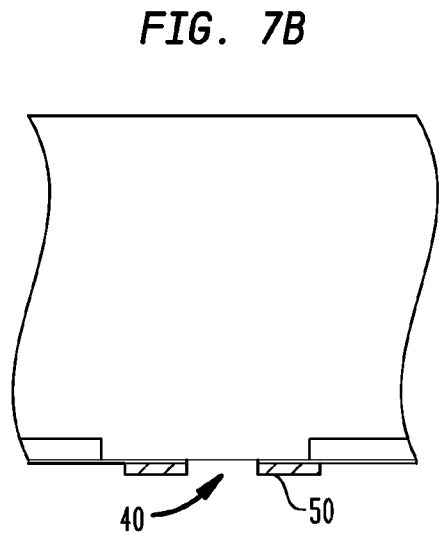

As illustrated in FIG. 7B, an etch process can be applied to a portion of the conductive pad 50 so as to remove a portion of the metal of the conductive pad. As a result, a hole 40 is formed that extends through the conductive pad 50 from the top surface 51 to the bottom surface 52 thereof. The hole 40 can be formed through the conductive pad 50 as described above with reference to FIG. 3D.

Figure 7C:
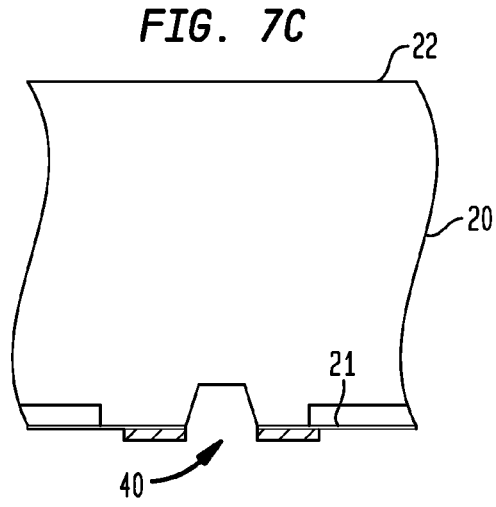

Thereafter, as illustrated in FIG. 7C, another etch process can be conducted in a manner that selectively etches the semiconductor material, e.g., silicon, thereby extending the hole 40 into the semiconductor element 20 from the front surface 21 towards the rear surface 22. The hole 40 can be extended into the semiconductor element 20 as described above with reference to FIG. 3E.

Figure 7D:
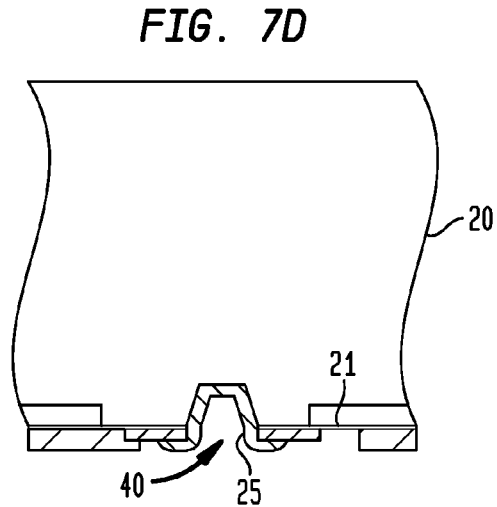

Thereafter, as illustrated in FIG. 7D, a photoimageable layer such as a photoresist or a dielectric layer 25 can be deposited onto the front surface 21 of the semiconductor element 20 and into the hole 40 as described above with reference to FIG. 3F.

Figure 7E:
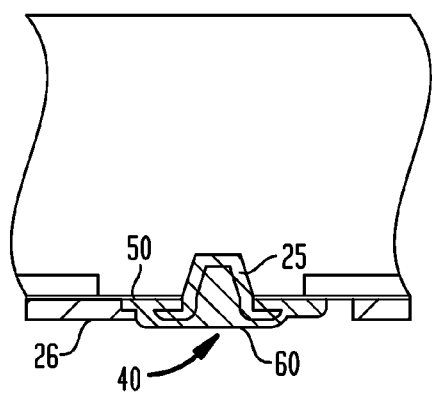

Thereafter, as illustrated in FIG. 7E, the conductive via 60 is deposited into the hole 40 overlying the portion of the dielectric layer 25 that is located within the hole, such that the shape of the conductive via 60 conforms to respective contours of the inner surface 41 of the hole, the exposed surface of the conductive pad 50, and an outer surface 26 of the dielectric layer, as described above with reference to FIG. 1. In a particular embodiment, the conductive via can be formed having an internal space therein, such as the conductive via 60a shown in FIG. 2. After formation of the conductive via 60, the support wafer (not shown in FIGS. 7A-7E) can be removed from the rear surface 22 of the semiconductor element 20.

Figure 7F:
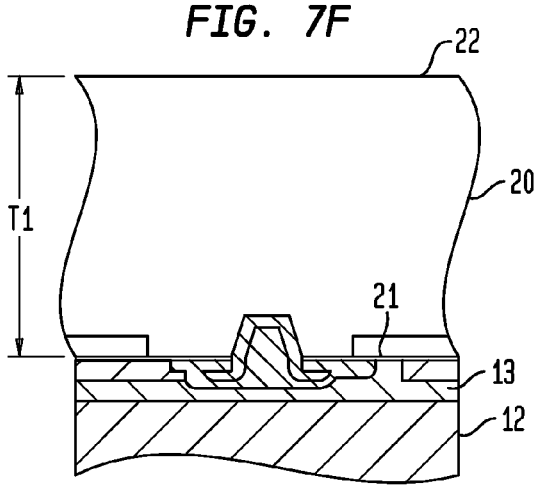

Thereafter, as illustrated in FIG. 7F, a support wafer 12 is temporarily attached to the front surface 21 of the semiconductor element 20 by an adhesive layer 13 to provide additional structural support to the semiconductor element during processing of the rear surface 22.

Figure 7G:
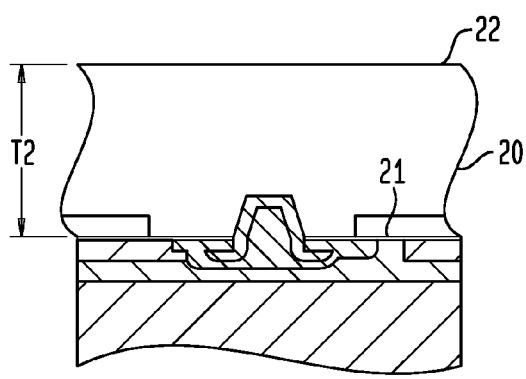
Figure 7H:
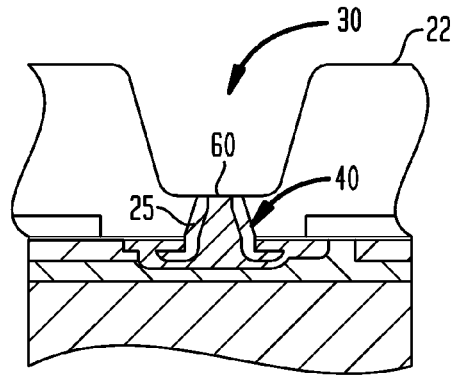

Thereafter, as illustrated in FIG. 7G, the thickness of the semiconductor element 20 between the front surface 21 and the rear surface 22 can be reduced. Grinding, lapping, or polishing of the rear surface or a combination thereof can be used to reduce the thickness. During this step, as an example, the initial thickness T1 (shown in FIG. 7F) of the semiconductor element 20 can be reduced from about 700 µm to a thickness T2 (shown in FIG. 7G) of about 130 µm or less.

Figure 7I:
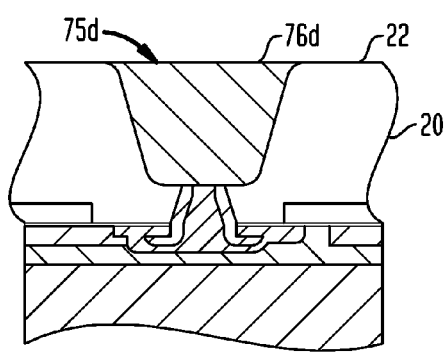

Thereafter, as illustrated in FIG. 7I, the opening 30 can be formed extending downwardly from the rear surface 22 to the hole 40, as described above with reference to FIG. 3A. An etch process can be applied to the portion of the dielectric layer 25 that is exposed within the opening 30 so as to expose the portion of the conductive via 60 that is aligned with the hole.

Thereafter, as illustrated in FIG. 7I, the dielectric region 75d can be formed inside the opening 30. Optionally, the dielectric region 75d can be formed such that an exposed outer surface 76d of the region is co-planar or substantially co-planar with the rear surface 22 of the semiconductor element an exposed surface of a dielectric layer coating the rear surface. For example, a self-planarizing dielectric material can be deposited in the opening 30, e.g., by a dispensing or stenciling process. In another example, a grinding, lapping, or polishing process can be applied to the rear surface 22 of the semiconductor element 20 after forming the dielectric region 75d to planarize the outer surface 76d of the dielectric region to the rear surface 22.

Figure 7J:
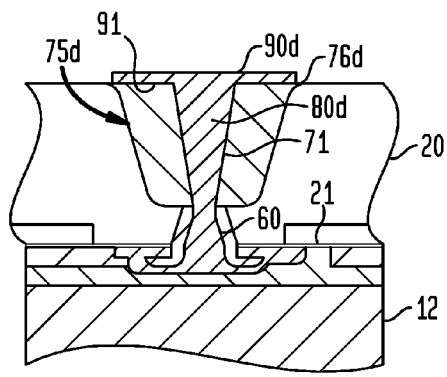

Thereafter, as illustrated in FIG. 7J, the first aperture 71 is formed, extending through the dielectric region 75d between the outer surface 76d of the dielectric region and the conductive via 60. The first aperture 71 can be formed, for example, via laser ablation, or any other appropriate method. The conductive interconnect 80d can be formed within the first aperture 71. The conductive interconnect 80d can be electrically connected to the conductive via 60 and insulated from the semiconductor element 20 by the dielectric region 75d. Then, the conductive contact 90d can be formed. The conductive contact 90d is exposed at the outer surface 76d of the dielectric region 75d for interconnection with an external device. The conductive contact 90d is electrically connected to the conductive interconnect 80d at the bottom surface 91 thereof. In some embodiments, the conductive interconnect 80d and the conductive contact 90d can be formed during a single electroless deposition step. In other embodiments, the conductive interconnect 80d and the conductive contact 90d can be formed by separate electroless deposition steps. After formation of the conductive interconnect 80d and the conductive contact 90d, the support wafer can be removed from the front surface 21 of the semiconductor element 20.

Finally, if a plurality of microelectronic units 10d are formed together on a single wafer (not shown), the microelectronic units can be severed from each other along dicing lanes by sawing or other dicing method to form individual microelectronic units.

Figure 8:
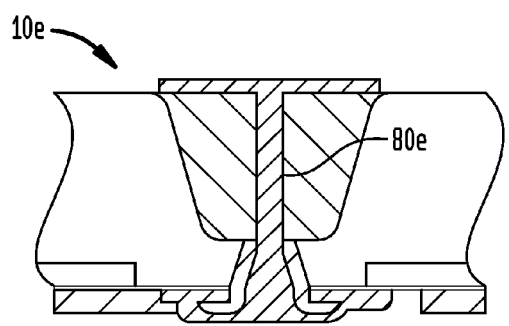
FIG. 8 is a sectional view illustrating a via structure in accordance with another embodiment.

FIG. 8 is a sectional view illustrating a variation of the via structure of FIG. 6 having an alternate conductive interconnect configuration. The microelectronic unit 10e is similar to the microelectronic unit 10d described above, but rather than having a conductive interconnect having a frusto-conical shape, the conductive interconnect 80e has a cylindrical shape.

Figure 9:
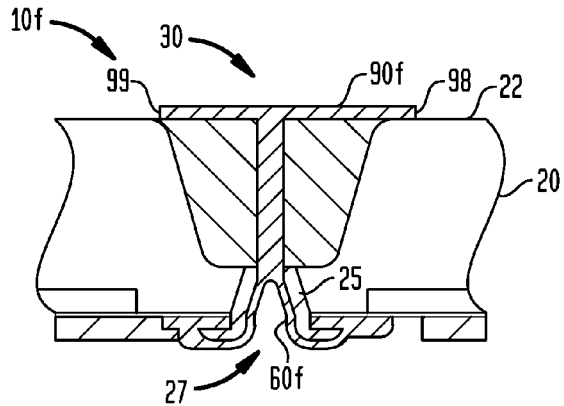
FIG. 9 is a sectional view illustrating a via structure in accordance with another embodiment.

FIG. 9 is a sectional view illustrating a variation of the via structure of FIG. 8 having an alternate conductive via configuration. The microelectronic unit 10f is similar to the microelectronic unit 10e described above, but rather than having a conductive via that fully fills the space inside of the hole that is not occupied by a dielectric layer, the conductive via 60f is deposited as a metallic layer onto the dielectric layer 25, such that an internal space 27 is created inside the conductive via 60f. As shown in FIG. 9, an edge 98 of the conductive contact 90f (or any of the conductive contacts disclosed herein) can overlie the rear surface 22 of the semiconductor element 20, or an edge 99 of the conductive contact (or any of the conductive contacts disclosed herein) can overlie the opening 30. In one embodiment (e.g., as shown in FIG. 8), the entire conductive contact can overlie the opening 30.

Figure 10:
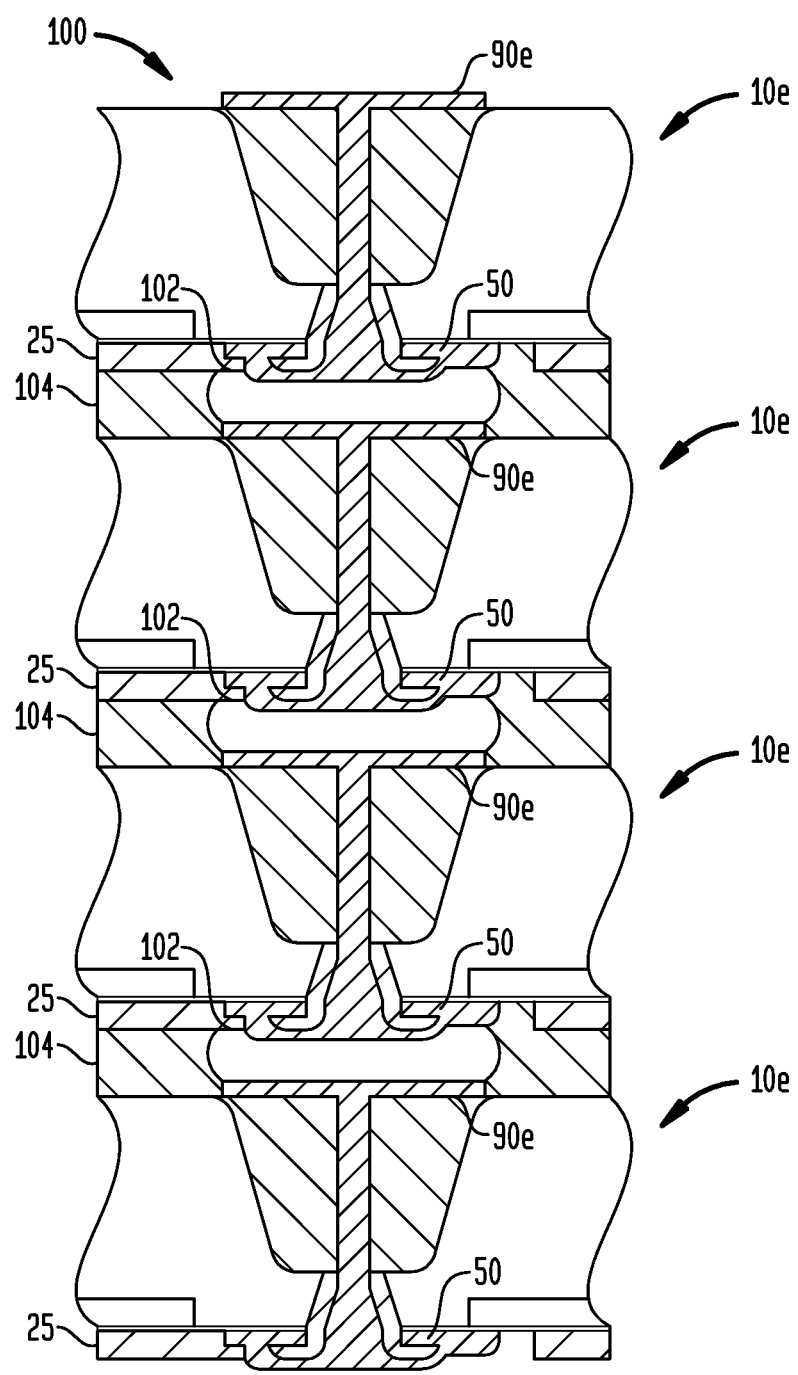
FIG. 10 is a sectional view illustrating a stacked assembly including a plurality of packaged chips having a via structure as shown in FIG. 8.

FIG. 10 is a sectional view illustrating a stacked assembly including a plurality of packaged chips having a via structure as shown in FIG. 8. In the embodiment shown, a stacked assembly 100 includes a plurality of microelectronic units 10e electrically connected to one another. Although FIG. 10 includes a plurality of microelectronic units 10e as shown in FIG. 8, any of the microelectronic units disclosed herein can be stacked to form a stacked assembly. Although FIG. 10 shows a stacked plurality of microelectronic units 10e, in a particular embodiment, the stacked assembly 100 (or any of the stacked assemblies disclosed herein) may be a portion of a stacked plurality of semiconductor wafers, each wafer containing a plurality of laterally adjacent microelectronic units 10e. Such a stacked wafer assembly can include a plurality of stacked assemblies 100, and the stacked assemblies 100 can be separated from one another by dicing lanes extending therebetween. The stacked assemblies 100 can be detached from one another, for example, by cutting along the dicing lanes with a laser.

By providing front surface conductive pads 50 and rear surface conductive contacts 90e in each microelectronic unit 10e, several microelectronic units can be stacked one on top of the other to form a stacked assembly 100 of microelectronic units. In such arrangement, the front surface conductive pads 50 are aligned with the rear surface conductive contacts 90e. Connection between respective adjacent ones of the microelectronic units in the stacked assembly is through conductive masses 102. The dielectric layer 25 on the front surface 21 and a dielectric region 104 extending between the dielectric layer and the rear surface 22 provide electrical isolation between adjacent microelectronic units 10e in the stacked assembly 100 except where interconnection is provided.

FIG. 11 is a sectional view illustrating a variation of the via structure of FIG. 5 having an alternate conductive interconnect configuration. The microelectronic unit 10g is similar to the microelectronic unit 10c described above, but rather than having a conductive interconnect that is filled with a dielectric region having an exposed outer surface, the microelectronic unit 10g has a conductive interconnect 80g that is filled with a dielectric region 75g that is surrounded by the conductive interconnect and a conductive contact 90g that is exposed at the rear surface 22g for connection with an external device. Also, rather than having a conductive via having an internal space, the microelectronic unit 10g includes a conductive via 60 that fully fills the space inside of the hole 40 as shown in FIG. 1. Additionally, the opening 30g has inner surfaces 31 that have a varying slope as the inner surfaces penetrate into the microelectronic element 20g from the rear surface 22 to a lower surface 32.

Figure 12:
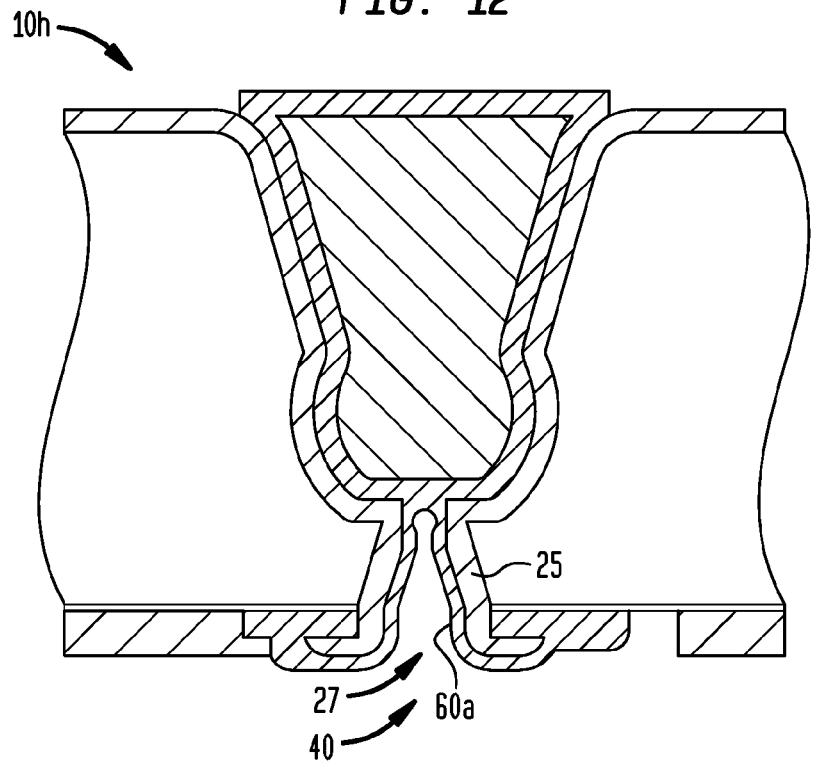
FIG. 12 is a sectional view illustrating a via structure in accordance with another embodiment.

FIG. 12 is a sectional view illustrating a variation of the via structure of FIG. 11 having an alternate conductive via configuration. The microelectronic unit 10h is similar to the microelectronic unit 10g described above, but rather than having a conductive via that fully fills the space inside of the hole 40 that is not occupied by the dielectric layer 25, the microelectronic unit 10h has a conductive via 60a including an internal space 27, as shown in FIG. 2.

A method of fabricating the microelectronic unit 10g will now be described, with reference to FIGS. 13A-13C. The microelectronic unit 10g is shown in FIGS. 13A-13C as first forming the hole from the front surface of the semiconductor element and then forming the opening from the rear surface thereof, similar to the method shown in FIGS. 7A-7J.

Figure 13A:
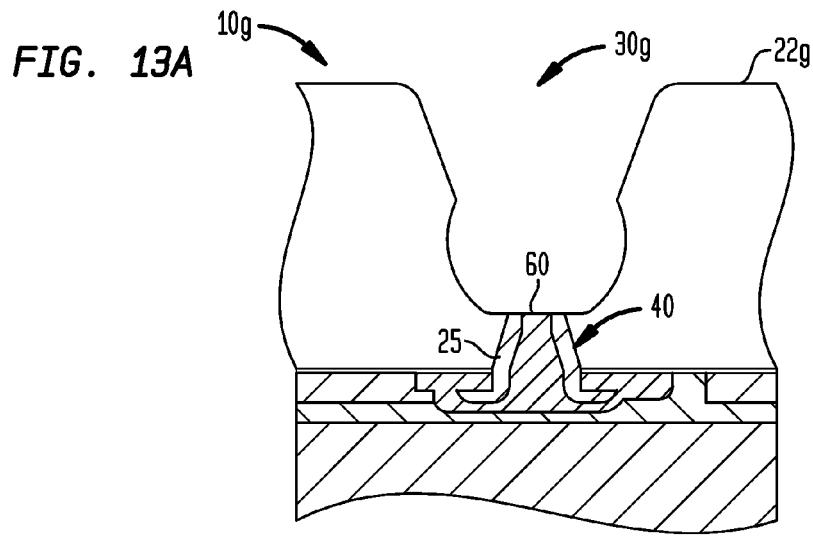
FIGS. 13A-13C are sectional views illustrating stages of fabrication in accordance with the embodiment of the invention depicted in FIG. 11.

Before the stage of fabrication shown in FIG. 13A, the microelectronic unit 10g can undergo the same stages of fabrication shown in FIGS. 7A-7G. Thereafter, as illustrated in FIG. 13A, the opening 30g can be formed extending downwardly from the rear surface 22g to the hole 40, as described above with reference to FIG. 7H. An etch process can be applied to the portion of the dielectric layer 25 that is exposed within the opening 30g so as to expose the portion of the conductive via 60 that is aligned with the hole.

Figure 13B:
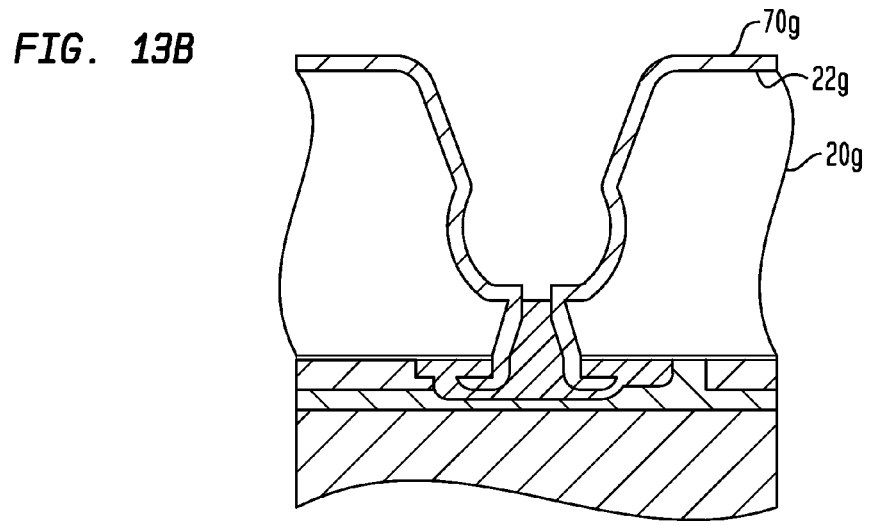

Thereafter, as illustrated in FIG. 13B, a photoimageable layer such as a photoresist or a dielectric layer 70g can be deposited onto the rear surface 22g of the semiconductor element 20g and in the opening 30g, as described above with reference to FIG. 3A.

Figure 13C:
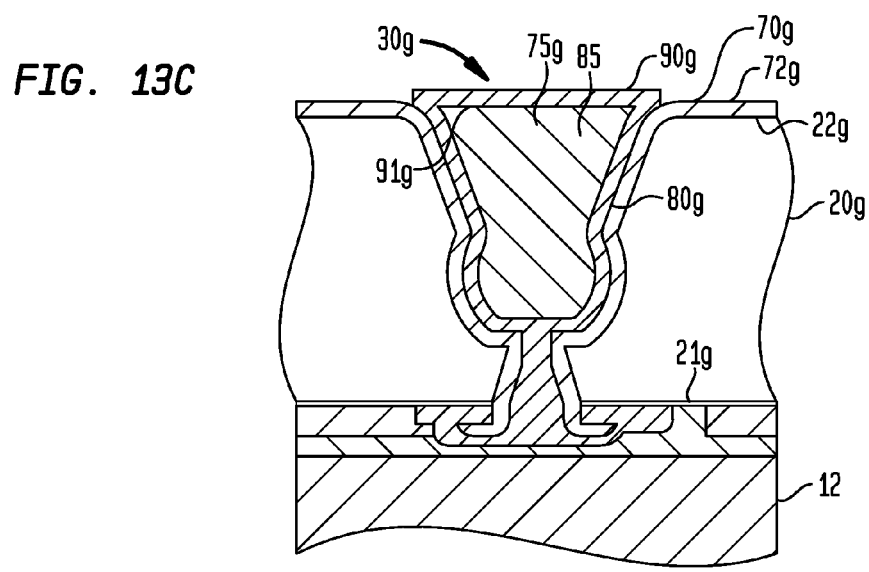

Thereafter, as illustrated in FIG. 13C, the conductive interconnect 80g is deposited as a metallic layer onto the dielectric layer 70g within the opening 30g, such that an internal space 85 is created inside the conductive interconnect. As described with reference to FIG. 3B, an exemplary method involves depositing a metal layer by one or more of sputtering a primary metal layer onto the outer surface 72g of the dielectric layer 70g, plating, or mechanical deposition.

Then, the internal space 85 can be filled with a dielectric region 75g, as described with reference to FIG. 7I. Optionally, the dielectric region 75g can be formed such that an exposed outer surface of the region is co-planar or substantially co-planar with the rear surface 22g of the semiconductor element an exposed surface 72g of the dielectric layer 70g.

Then, the conductive contact 90g can be formed. The conductive contact 90g is exposed at the outer surface of the dielectric region 75g for interconnection with an external device. The conductive contact 90g is electrically connected to the upper edges of the conductive interconnect 80g at the bottom surface 91g thereof. After formation of the conductive interconnect 80g and the conductive contact 90g, the support wafer 12 can be removed from the front surface 21g of the semiconductor element 20g.

FIG. 14 is a sectional view illustrating a variation of the via structure of FIG. 5 having an alternate conductive interconnect configuration. The microelectronic unit 10i is similar to the microelectronic unit 10c described above, but rather than having a conductive interconnect that coats the entire outer surface of the dielectric layer that is located within the opening, the microelectronic unit 10i has a conductive interconnect 80i that has the shape of a trace that only coats a portion of the outer surface 72 of the dielectric layer 70 that is located within the opening 30. Also, the conductive contact 90i has the shape of a trace that extends along the portion of the outer surface 72 of the dielectric layer 70 that coats the rear surface 22 of the semiconductor element 20 not overlying the opening 30. Also, rather than having a conductive via having an internal space, the microelectronic unit 10i includes a conductive via 60 that fully fills the space inside of the hole 40 as shown in FIG. 1.

A method of fabricating the microelectronic unit 10i will now be described, with reference to FIGS. 15A-15I. The microelectronic unit 10i is shown in FIGS. 15A-15I as first forming the hole from the front surface of the semiconductor element and then forming the opening from the rear surface thereof, similar to the method shown in FIGS. 7A-7J.

Figure 15A:
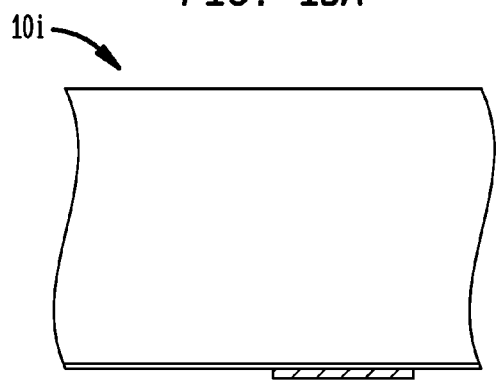
FIGS. 15A-15I are sectional views illustrating stages of fabrication in accordance with the embodiment of the invention depicted in FIG. 14.
Figure 15B:
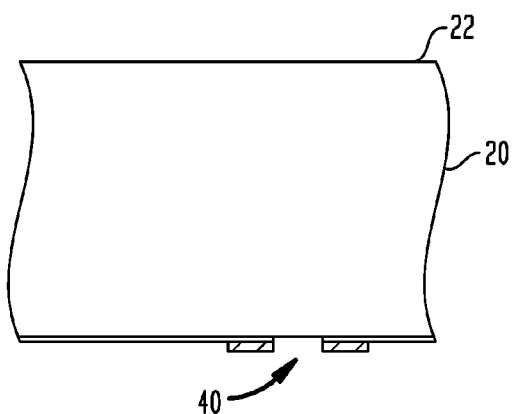
Figure 15C:
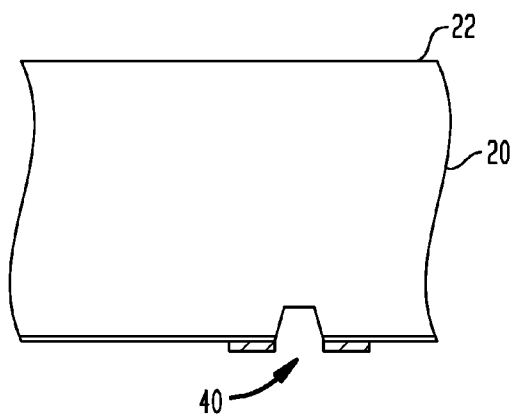
Figure 15D:
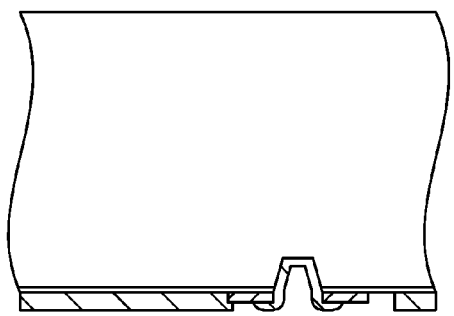

As shown in FIGS. 15A-15G, the microelectronic unit 10i can undergo the same stages of fabrication shown in FIGS. 7A-7G, although the hole 40 formed during the stages shown in FIGS. 15A and 15B is formed leaving sufficient room on the rear surface 22 of the semiconductor element 20 to allow for the formation of the trace-shaped conductive contact 90i that does not overlay (i.e., is laterally offset from) the opening 30.

Figure 15E:
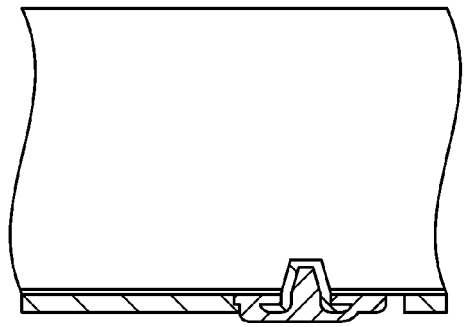
Figure 15F:
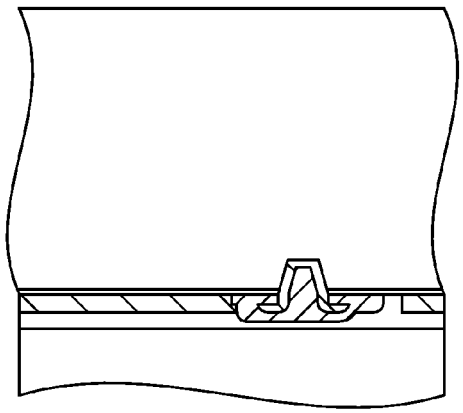
Figure 15G:
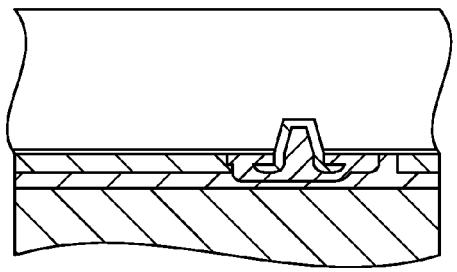
Figure 15H:
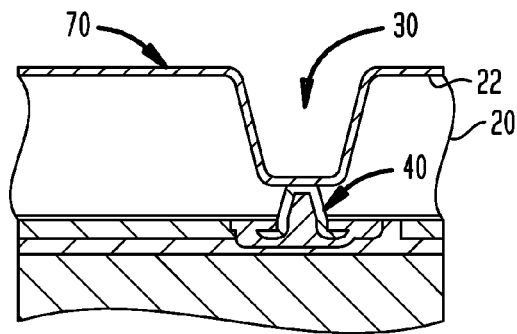

Thereafter, as illustrated in FIG. 15E, the opening 30 can be formed extending downwardly from the rear surface 22 to the hole 40, as described above with reference to FIG. 7H. Then, a photoimageable layer such as a photoresist or a dielectric layer 70 can be deposited onto the rear surface 22 of the semiconductor element 20 and in the opening 30, as described above with reference to FIG. 13B.

Figure 15I:
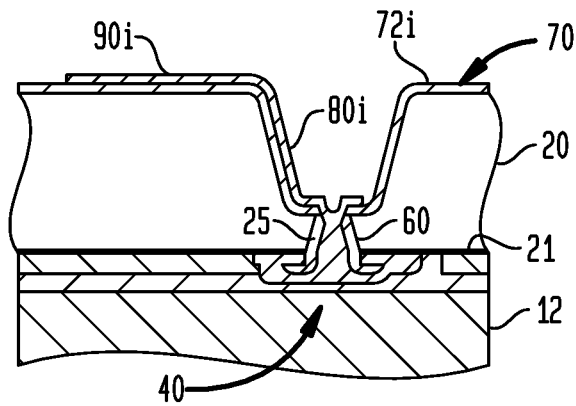

Thereafter, as illustrated in FIG. 15I, an etch process can be applied to the portion of the dielectric layer 70 that overlies the hole 40 and the portion of the dielectric layer 25 that is exposed within the opening 30 so as to expose the portion of the conductive via 60 that is aligned with the hole.

Then, a trace-shaped conductive interconnect 80i and a trace-shaped conductive contact 90i can be deposited as a metallic layer onto the dielectric layer 70 within the opening 30 (the conductive interconnect) and extending along the rear surface 22 (the conductive contact), respectively. An exemplary method of forming the conductive interconnect 80i and the conductive contact 90i can be a non-lithographic technique such as selectively treating a surface with a laser. The conductive contact 90i is exposed at the outer surface 72 of the dielectric layer 70 for interconnection with an external device. The conductive contact 90i is laterally offset from (i.e., does not vertically overlie) the conductive pad 50.

Thereafter, referring again to FIG. 14, the remaining space within the opening 30 not occupied by the conductive interconnect 80i can be filled with a dielectric region 75i, as described with reference to FIG. 7I. Optionally, the dielectric region 75i can be formed such that an exposed outer surface 76i of the region is co-planar or substantially co-planar with the exposed surface 72i of the dielectric layer 70i. After formation of the dielectric region 75i, the support wafer 12 can be removed from the front surface 21 of the semiconductor element 20.

Figure 16:
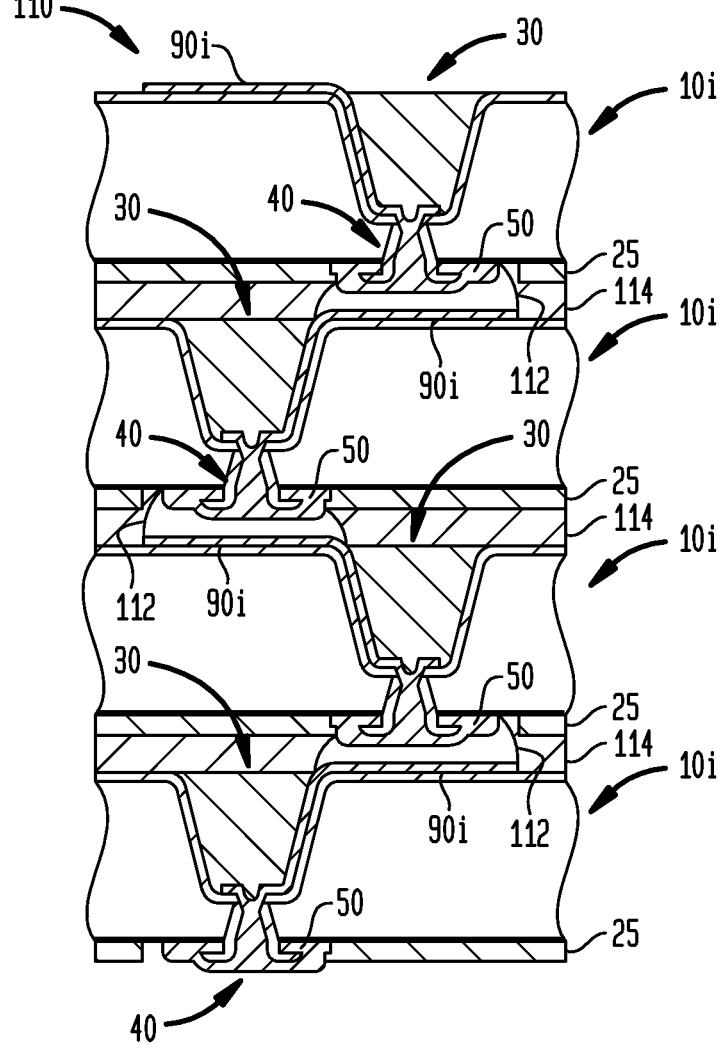
FIG. 16 is a sectional view illustrating a stacked assembly including a plurality of packaged chips having a via structure as shown in FIG. 14.

FIG. 16 is a sectional view illustrating a stacked assembly including a plurality of packaged chips having a via structure as shown in FIG. 14. In the embodiment shown, a stacked assembly 110 includes a plurality of microelectronic units 10i electrically connected to one another.

Similar to FIG. 10, several microelectronic units 10i can be stacked one on top of the other to form a stacked assembly 110 of microelectronic units. Because in a particular microelectronic unit 10i, the conductive contact 90i does not vertically overlie the conductive pad 50, each adjacent pair of microelectronic units is positioned with the respective openings 30 and holes 40 offset such that the conductive pad 50 of an upper microelectronic unit overlies the conductive contact 90i of a lower microelectronic unit.

In such arrangement, similar to FIG. 10, connection between respective adjacent ones of the microelectronic units in the stacked assembly is through conductive masses 112. The dielectric layer 25 on the front surface 21 and a dielectric region 114 extending between the dielectric layer and the rear surface 22 provide electrical isolation between adjacent microelectronic units 10i in the stacked assembly 110 except where interconnection is provided.

FIG. 17 is a sectional view illustrating a variation of the via structure of FIG. 8 having an alternate conductive via configuration. The microelectronic unit 10j is similar to the microelectronic unit 10e described above, but rather than having a conductive via being conformal to a dielectric layer located within the hole, the microelectronic unit 10j includes a conductive via portion 60j of a conductive interconnect 78 extending through and non-conformal to a dielectric region 65 located within the hole 40.

The microelectronic unit 10j includes a single unitary conductive interconnect 78 extending between the conductive pad 50j and the conductive contact 90j. The conductive interconnect 78 includes a conductive interconnect portion 80j extending from the conductive contact 90j through the opening 30 and a conductive via portion 60j extending from the conductive interconnect portion to the conductive pad 50j through the hole 40. The conductive interconnect 78 extends through an aperture 71j extending through the dielectric regions 75j and 65. The aperture 71j and the conductive interconnect 78 do not conform to a contour of either the opening 30 or the hole 40.

As shown in FIG. 17, a dielectric region 75j can fill the remainder of the opening 30 that is not occupied by the conductive interconnect portion 80j, such that an outer surface 76j extends above but is parallel to a plane defined by the rear surface 22 of the semiconductor element 20. The dielectric region 65 can fill the remainder of the opening 40 that is not occupied by the conductive via portion 60j.

In a particular embodiment (not shown), the microelectronic unit 10j can include a single unitary dielectric region that fills the remainder of the opening 30 and the hole 40 that is not occupied by the conductive interconnect 78. Alternatively, such a single dielectric region can include two or more layers of material.

In the embodiment shown in FIG. 17, the degree of compliancy provided by the product of the thickness of the dielectric region 75j and its modulus of elasticity can be sufficient to compensate for strain applied to the conductive contact 90j due to thermal expansion mismatch between the microelectronic unit 10j and a substrate to which the microelectronic unit is mounted through the conductive contact. An underfill (not shown) can be provided between the exposed outer surface 76j of the dielectric region and such circuit panel to enhance resistance to thermal strain due to CTE mismatch.

Figure 18A:
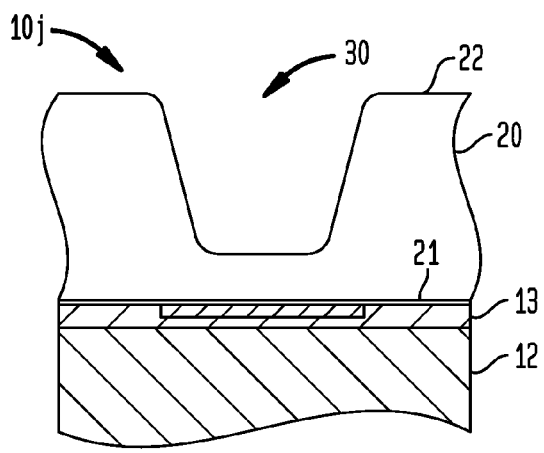
FIGS. 18A-18G are sectional views illustrating stages of fabrication in accordance with the embodiment of the invention depicted in FIG. 17.

A method of fabricating the microelectronic unit 10j will now be described, with reference to FIGS. 18A-18G. As illustrated in FIG. 18A, the opening 30 can be formed extending downwardly from the rear surface 22 towards the front surface 21 of the semiconductor element 20, in a manner similar to that described above with respect to FIG. 3A. A support wafer 12 is temporarily attached to the front surface 21 of the semiconductor element 20 by an adhesive layer 13 to provide additional structural support to the semiconductor element during processing of the rear surface 22.

Figure 18B:
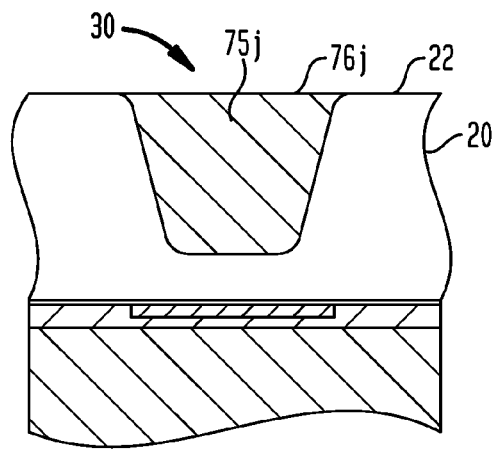

Thereafter, as illustrated in FIG. 18B, the dielectric region 75j can be formed inside the opening 30, in a manner similar to that described above with respect to FIG. 7I. Optionally, the dielectric region 75j can be formed such that an exposed outer surface 76j of the region is co-planar or substantially co-planar with the rear surface 22 of the semiconductor element 20.

Figure 18C:
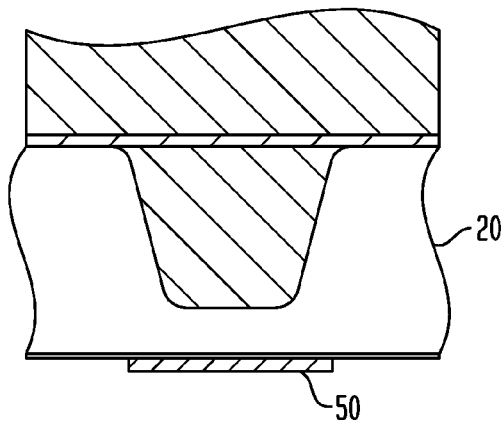
Figure 18D:
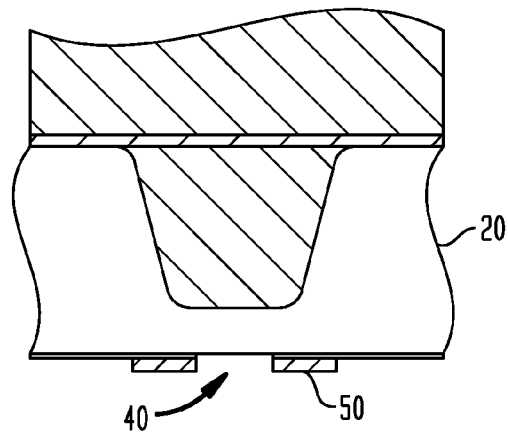
Figure 18E:
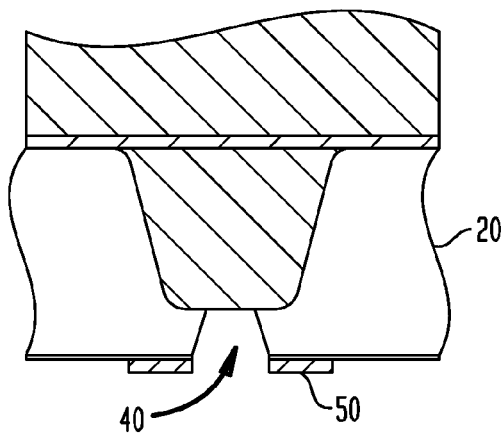

Thereafter, as illustrated in FIGS. 18C-18E, the microelectronic unit 10j can undergo the same stages of fabrication shown in FIGS. 3C-3E to form the hole 40 extending through the conductive pad 50 and into the semiconductor element 20. As described above with reference to FIGS. 3D and 3E, the process steps shown in FIGS. 18D and 18E can be combined into a single process step, thereby forming the hole 40 in such single step with a laser.

Figure 18F:
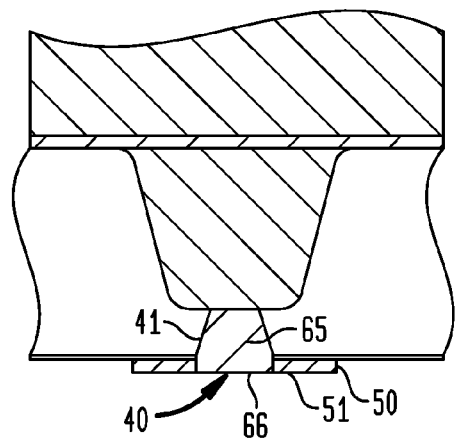

Thereafter, as illustrated in FIG. 18F, the dielectric region 65 can be formed inside the hole 40, in a manner similar to that described above with respect to FIG. 7I. The dielectric region 65 can extend through the semiconductor element 20 to meet a portion of the dielectric region 75j that is exposed within the hole 40. Optionally, the dielectric region 65 can be formed such that an exposed outer surface 66 of the region is co-planar or substantially co-planar with the top surface 51 of the conductive pad 50. In a particular embodiment (not shown), the dielectric region 65 can extend out of the hole 40 onto the top surface 51 of the conductive pad 50, similar to how the dielectric layer 25 shown in FIG. 1 extends out of the hole onto the top surface of the conductive pad.

Figure 18G:
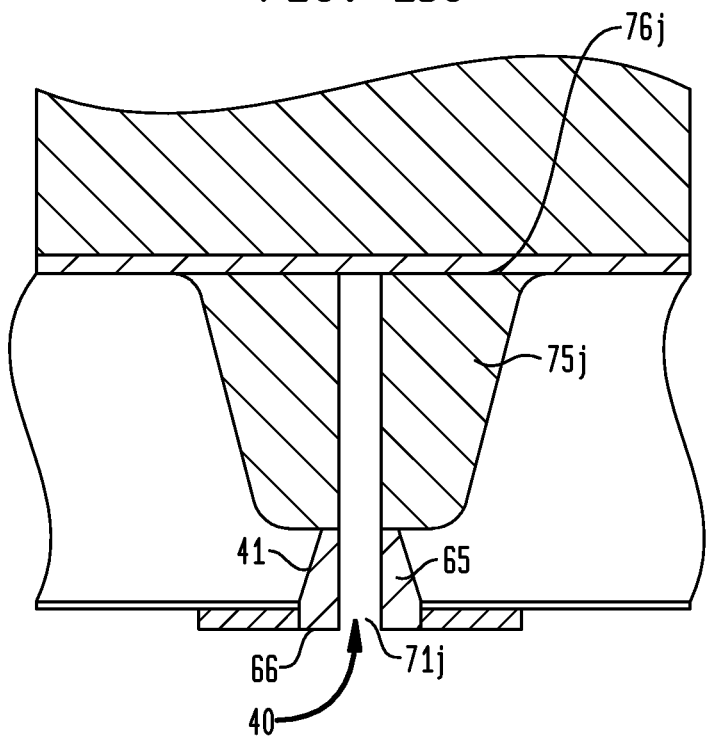

Thereafter, as illustrated in FIG. 18G, a single aperture 71j is created extending through the dielectric regions 75j and 65 from the outer surface 76j to the outer surface 66, for example via laser ablation or mechanical drilling. In a particular embodiment, the hole 40 and the aperture 71j can be formed in a single process step using a laser, thereby combining the process steps shown in FIGS. 18D, 18E, and 18G. In such an embodiment, a dielectric layer or region coating the exposed inner surface 41 of the hole 40 such as the dielectric region 65 can be formed (e.g., as shown in FIG. 18F) after the formation of the hole 40 and the aperture 71j.

Thereafter, referring again to FIG. 17, the conductive interconnect 78 is created by plating an interior surface of the aperture 71 with a conductive metal such as copper or gold. Similar to the conductive interconnect 80d shown in FIG. 6, the conductive interconnect 78 may be solid or may contain an internal space that is left open or filled with a dielectric material. Preferably, the conductive interconnect 78 is plated onto an interior surface of the aperture 71 as well as the top surface 51 of the conductive pad 50, resulting in a thicker conductive pad 50j having at least two layers of metal.

Then, the conductive contact 90j can be formed. The conductive contact 90j is exposed at the outer surface 76j of the dielectric region 75j for interconnection with an external device. In some embodiments, the conductive interconnect 78 and the conductive contact 90j can be formed during a single electroless deposition step. In other embodiments, the conductive interconnect 78 and the conductive contact 90j can be formed by separate electroless deposition steps. After formation of the conductive interconnect 78 and the conductive contact 90j, the support wafer can be removed from the front surface 21 of the semiconductor element 20.

Figure 19:
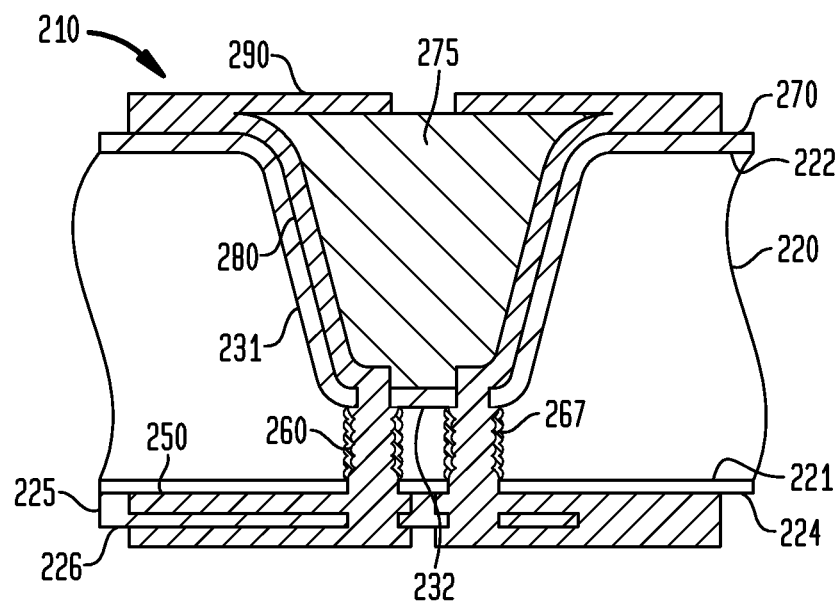
FIG. 19 is a sectional view illustrating a via structure in accordance with another embodiment.

FIG. 19 is a sectional view illustrating a via structure in accordance with another embodiment having a plurality of holes extending to a single opening. As illustrated in FIG. 19, a microelectronic unit 210 includes a semiconductor element 220 having an opening 230 extending from a rear surface 222 partially through the semiconductor element 220 towards a front surface 221 remote from the rear surface. The semiconductor element 220 also has a plurality of holes 240 extending through respective conductive pads 250 exposed at the front surface 221, each of the holes 240 meeting the single opening 230 at a location between the front surface and the rear surface 222. A respective conductive via 260 extends within each hole 240, and a respective conductive interconnect 280 extends from each conductive via within the opening 230 to a respective conductive contact 290 exposed at the rear surface 222 for electrical connection with an external device.

As shown in FIG. 19, each conductive via 260 can fill all of the volume within a respective hole 240 inside of a dielectric layer 267 that electrically insulates the semiconductor element 220 from the conductive via. The conductive interconnects 280 extend along an outer surface 272 of a dielectric layer 270 that is conformal to inner surfaces 231 and a lower surface 232 of the opening 230, such that the conductive interconnects are conformal to a contour of the opening.

The semiconductor element 220 can further include a dielectric layer 224 (e.g., a passivation layer) located between the front surface 221 and the conductive pads 250. A dielectric region 275 can fill the remainder of the opening 230 that is not occupied by the conductive interconnects 280 or the dielectric layer 270, such that an outer surface 276 extends above but is parallel to a plane defined by the rear surface 222 of the semiconductor element 220.

The microelectronic element 210 can have various combinations of holes 40 extending to a single opening 30. For example, FIG. 20A illustrates a microelectronic unit 210a that can be one potential top-down plan view of the microelectronic unit 210 shown in FIG. 19. As shown in FIG. 20A, the microelectronic element 210a includes four holes 240 extending to a single opening 230 having a substantially round top-view shape. Each hole 240 extends through a corner of a corresponding square-shaped conductive pad 250 to the opening 230.

FIG. 20B illustrates a microelectronic unit 210b that can be another potential top-down plan view of the microelectronic unit 210 shown in FIG. 19. As shown in FIG. 20B, the microelectronic element 210b includes two holes 240 extending to a single opening 230 having a substantially oval top-view shape. Each hole 240 extends through a side of a corresponding square-shaped conductive pad 250 to the opening 230.

FIG. 20C illustrates a semiconductor element 220c that can be a potential perspective view of the semiconductor element 220 included in the microelectronic unit 210 shown in FIG. 19. The semiconductor element 220c includes a plurality of holes 240 extending to a single opening 230 having a channel shape extending in a plurality of lateral directions perpendicular to a thickness of the semiconductor element. A row of holes 240 extends along each lateral direction defined by channel-shaped opening 230. In a particular embodiment, the opening 230 can have having a length extending in a first direction along a surface of the semiconductor element 220, and a width extending a second lateral direction transverse to said first direction, the length being greater than the width.

A method of fabricating the microelectronic unit 210 shown in FIG. 19 will now be described, with reference to FIGS. 21A-21D. The microelectronic unit 210 is shown in FIGS. 21A-21D as first having formed the opening from the front surface of the semiconductor element and then forming the holes from the rear surface thereof, similar to the method shown in FIGS. 3A-3F.

Figure 21A:
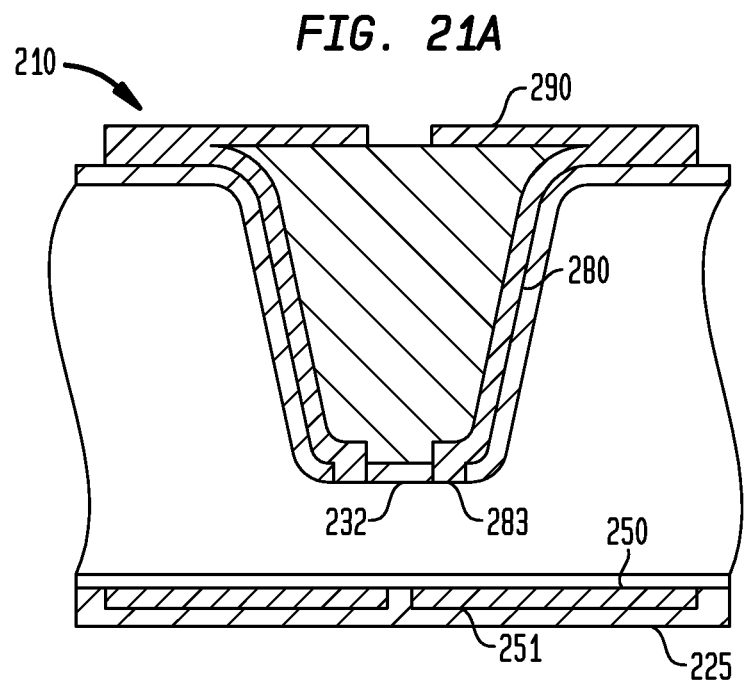
FIGS. 21A-21D are sectional views illustrating stages of fabrication in accordance with the embodiment of the invention depicted in FIG. 19.

Before the stage of fabrication shown in FIG. 21A, the microelectronic unit 210 can undergo similar stages of fabrication shown in FIGS. 13A-13C, wherein: (i) an opening is formed extending from the front surface of the semiconductor element, (ii) interior surfaces of the opening are coated with a conformal dielectric layer, (iii) a conformal conductive interconnect is plated onto an outer surface of the dielectric layer, (iv) a dielectric region is filled into the remaining portion of the opening not occupied by the dielectric layer or the conductive interconnect, (v) a conductive contact is plated onto the outer surface of the dielectric region, and (vi) the front surface of the semiconductor element is coated with a conformal dielectric layer.

As illustrated in FIG. 21A, the microelectronic unit 210 includes two conductive interconnects 280, each conductive interconnect extending from a respective conductive contact 290 to a lower surface 232 of the opening 230, such that a lower end 283 of each conductive interconnect 280 overlies a portion of a respective conductive pad 250. A dielectric layer 225 has been deposited onto the front surface 221 of the semiconductor element 220 and onto the top surface 251 of each conductive pad 250.

Figure 21B:
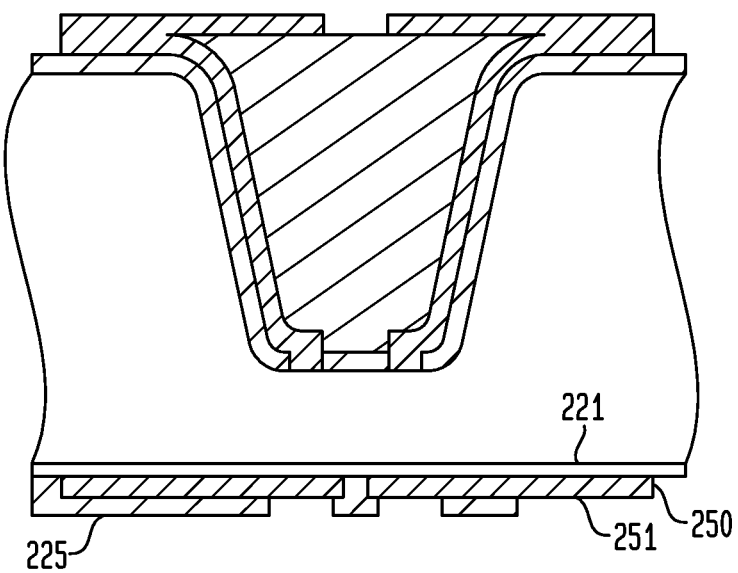

Thereafter, as illustrated in FIG. 21B, an etch process can be applied to a portion of the dielectric layer 225, leaving remaining portions of the dielectric layer on the front surface 221 where it is desired to electrically insulate portions of the front surface conductive vias 260 that will be deposited later. As shown, a portion of the top surface 251 of each conductive pad 250 remains coated by the dielectric layer 225. In a particular embodiment, the entire top surface 251 of each conductive pad 250 can be exposed within the openings created in the dielectric layer 225.

Figure 21C:
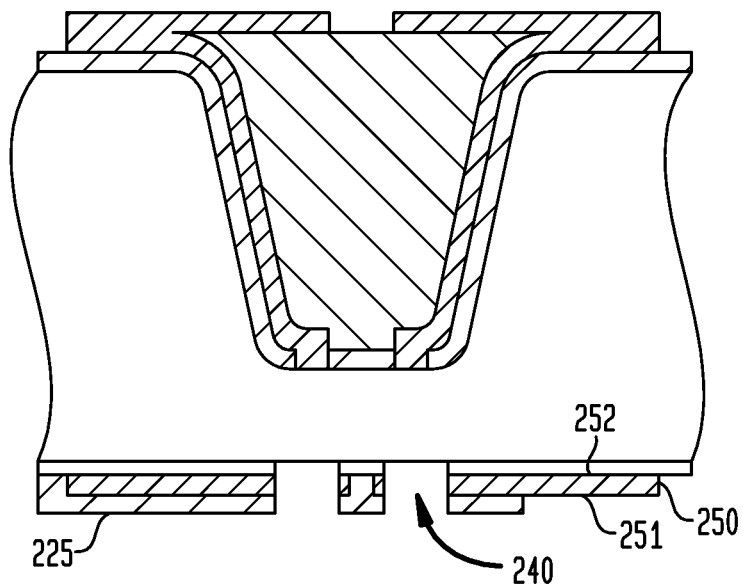

Thereafter, as illustrated in FIG. 21C, an etch process can be applied to a portion of each conductive pad 250 so as to remove a portion of the metal of the conductive pad. As a result, a hole 240 is formed that extends through each conductive pad 250 from the top surface 251 to the bottom surface 252 thereof. Each hole 240 can be formed through the respective conductive pad 250 as described above with reference to FIG. 3D.

Figure 21D:
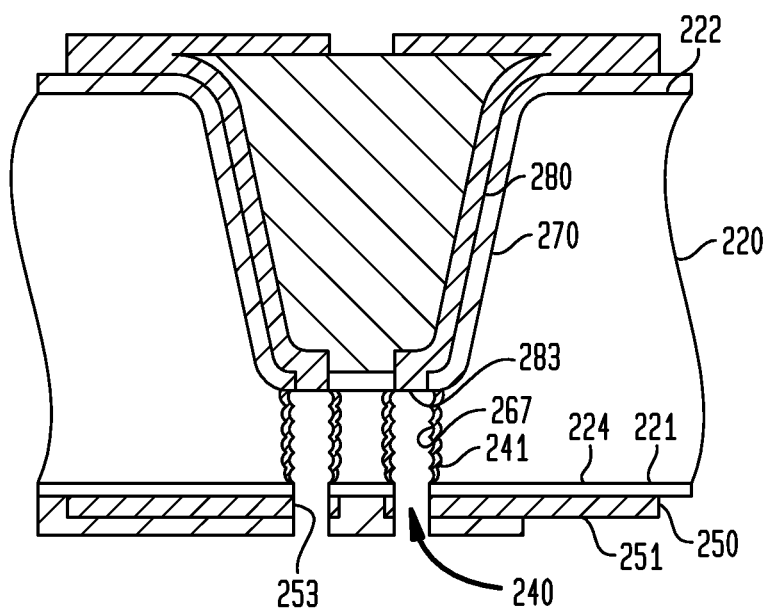

Thereafter, as illustrated in FIG. 21D, another etch process can be conducted in a manner that selectively etches the semiconductor material, e.g., silicon, thereby extending the holes 240 into the semiconductor element 220 from the front surface 221 towards the rear surface 222, thereby exposing the lower ends 283 of the respective conductive interconnects 280. The holes 240 can be extended into the semiconductor element 220 as described above with reference to FIG. 3E. Then, a dielectric layer 267 can be deposited onto the inner surface 241 of each respective hole 240 as described above with reference to FIG. 3F. As shown in FIG. 21D, the dielectric layer 267 extends between the dielectric layer 270 exposed at each hole 240 and the passivation layer 224. In a particular embodiment, the dielectric layer 267 can extend completely through the conductive pad 250, contacting an interior surface 253 of the conductive pad exposed within the hole 240, and the dielectric layer 267 can extends out of the hole and contact the top surface 251 of the conductive pad.

Thereafter, referring again to FIG. 19, the conductive vias 260 can be deposited into the respective holes 240 overlying the dielectric layers 267 and 225, for example, by blanket deposition, such that the shape of each conductive via 260 conforms to respective contours of the inner surface 241 of the hole, the exposed surface of the conductive pad 250, and an outer surface 226 of the dielectric layer 225. Each conductive via 260 extends from the exposed lower end 283 of the respective conductive interconnect 280 to exposed portions of the top surface 251 and interior surface 253 (visible in FIG. 21D) of the conductive pad 250.

FIG. 22 is a sectional view illustrating a variation of the via structure of FIG. 14 having an alternate conductive pad and conductive via configuration. The microelectronic unit 10k is similar to the microelectronic unit 10i described above with respect to FIG. 14, but rather than having a hole penetrating through a conductive pad at least partially overlying the opening, the hole 40k and the opening 30k are created at locations that are laterally offset from the conductive pad 50k. A conductive trace 68 extends along the front surface 21 of the conductive element 20k to electrically connect the conductive via 60k with the conductive pad 50k. Also, rather than having a solid conductive via, the microelectronic unit 10k includes a conductive via 60k having an internal space such as that shown in FIG. 2.

A method of fabricating the microelectronic unit 10k will now be described, with reference to FIGS. 23A-23J. The microelectronic unit 10k is shown in FIGS. 23A-23J as first forming the hole from the front surface of the semiconductor element and then forming the opening from the rear surface thereof, similar to the method shown in FIGS. 15A-15I.

Figure 23A:
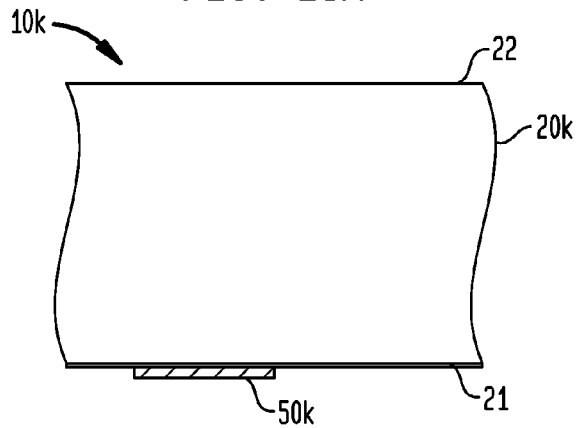

As illustrated in FIG. 23A, the microelectronic unit 10k has one or more conductive pads 50k located at the front surface 21 of the semiconductor element 20k. A support wafer (such as that shown in FIGS. 3C-3F) can be temporarily attached to the rear surface 22 of the semiconductor element 20k to provide additional structural support to the semiconductor element during processing of the front surface 21.

Figure 23B:
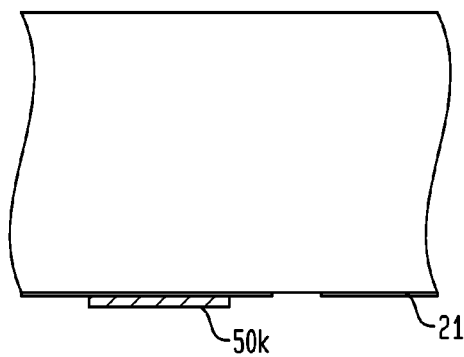
Figure 23C:
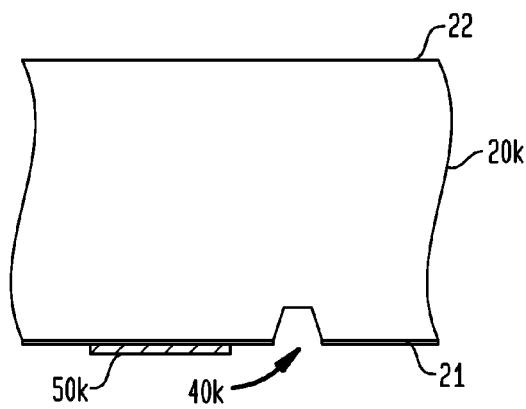

Thereafter, as illustrated in FIG. 23B, a portion of the passivation layer 24 can be removed at a location where it is desired to form the hole 40k, the location being laterally offset from the conductive pad 50k Thereafter, as illustrated in FIG. 23C, another etch process can be conducted in a manner that selectively etches the semiconductor material, e.g., silicon, thereby forming the hole 40k into the semiconductor element 20k from the front surface 21 towards the rear surface 22. The hole 40k is formed at a location that is laterally offset from the conductive pad 50k. The hole 40k can be etched into the semiconductor element 20 as described above with reference to FIG. 3E.

Figure 23D:
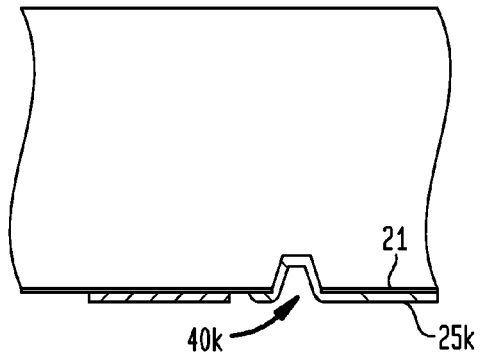

Thereafter, as illustrated in FIG. 23D, a photoimageable layer such as a photoresist or a dielectric layer 25k can be deposited onto the front surface 21 of the semiconductor element 20 and into the hole 40k as described above with reference to FIG. 3F.

Figure 23E:
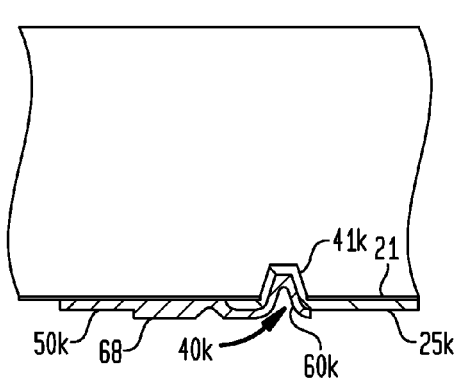

Thereafter, as illustrated in FIG. 23E, the conductive via 60k is deposited into the hole 40k overlying the portion of the dielectric layer 25k that is located within the hole, such that the shape of the conductive via 60k conforms to respective contours of the inner surface 41k of the hole. The conductive via 60k can be formed having an internal space therein, similar to as the conductive via 60a shown in FIG. 2. The conductive contact 68 can be formed, extending between the conductive via 60k and the conductive pad 50k along the front surface 21. In a particular embodiment, the conductive via 60k and the conductive trace 68 can be formed during a single electroless deposition step.

Figure 23F:
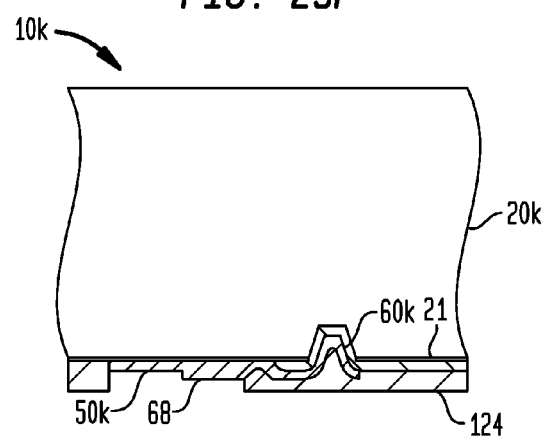

Thereafter, as illustrated in FIG. 23F, a photoimageable layer such as a photoresist or a dielectric layer 124 can be deposited onto the front surface 21 of the semiconductor element 20k and onto portions of the conductive via 60k, the conductive trace 68, and/or the conductive pad 50k to provide electrical isolation between adjacent microelectronic units 10k, for example, in a stacked assembly such as that shown in FIG. 24. After formation of the dielectric layer 124, a support wafer (if used) can be removed from the front surface 21 of the semiconductor element 20.

Figure 23G:
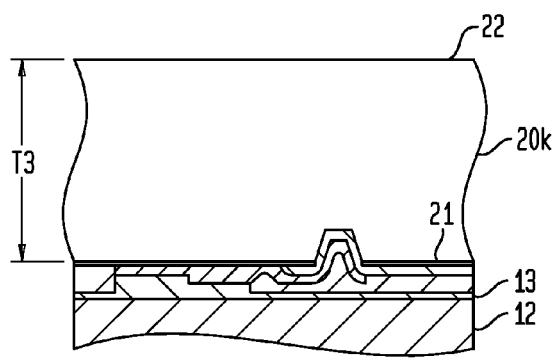
Figure 23H:
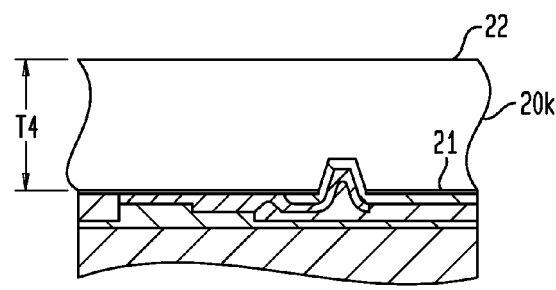

Thereafter, as illustrated in FIG. 23G, a support wafer 12 is temporarily attached to the front surface 21 of the semiconductor element 20k by an adhesive layer 13 to provide additional structural support to the semiconductor element during processing of the rear surface 22.

Thereafter, as illustrated in FIG. 23E, the thickness of the semiconductor element 20k between the front surface 21 and the rear surface 22 can be reduced as described with reference to FIGS. 7F and 7G. During this step, as an example, the initial thickness T3 (shown in FIG. 23G) of the semiconductor element 20k can be reduced to a thickness T4 (shown in FIG. 23H).

Thereafter, as illustrated in FIG. 23I, the opening 30k can be formed extending downwardly from the rear surface 22 to the hole 40k, as described above with reference to FIG. 7H. Then, a photoimageable layer such as a photoresist or a dielectric layer 70k can be deposited onto the rear surface 22 of the semiconductor element 20k and in the opening 30k, as described above with reference to FIG. 13B.

Thereafter, as illustrated in FIG. 23J, an etch process can be applied to the portion of the dielectric layer 70k that overlies the hole 40k and the portion of the dielectric layer 25k that is exposed within the opening 30k so as to expose the portion of the conductive via 60k that is aligned with the hole.

Then, a trace-shaped conductive interconnect 80k and a trace-shaped conductive contact 90k can be deposited as a metallic layer onto the dielectric layer 70k within the opening 30k (the conductive interconnect) and extending along the rear surface 22 (the conductive contact), respectively, as described above with reference to FIG. 15I. The conductive contact 90k is exposed at the outer surface 72 of the dielectric layer 70k for interconnection with an external device or with another microelectronic unit 10k in a stacked assembly. The conductive contact 90k is laterally offset from the opening 30k and the hole 40k, but the conductive contact is vertically aligned with (i.e., overlying) the conductive pad 50k.

Thereafter, referring again to FIG. 22, the remaining space within the opening 30k not occupied by the conductive interconnect 80k or the dielectric layer 70k can be filled with a dielectric region 75k, as described with reference to FIG. 7I. After formation of the dielectric region 75k, the support wafer 12 can be removed from the front surface 21 of the semiconductor element 20k.

FIG. 24 is a sectional view illustrating a stacked assembly including a plurality of packaged chips having a via structure as shown in FIG. 22. In the embodiment shown, a stacked assembly 120 includes a plurality of microelectronic units 10k electrically connected to one another.

Similar to FIG. 16, several microelectronic units 10k can be stacked one on top of the other to form a stacked assembly 120 of microelectronic units. Because in a particular microelectronic unit 10k, the conductive contact 90k vertically overlies the conductive pad 50k, each adjacent pair of microelectronic units can be positioned with the respective openings 30k and holes 40k vertically aligned such that the conductive pad 50k of an upper microelectronic unit overlies the conductive contact 90k of a lower microelectronic unit.

In such arrangement, similar to FIG. 16, connection between respective adjacent ones of the microelectronic units in the stacked assembly is through conductive masses 122. The dielectric layer 124 at the front surface 21 and the dielectric region 75k at the rear surface 22 provide electrical isolation between adjacent microelectronic units 10k in the stacked assembly 120 except where interconnection is provided. An adhesive layer 126 located between the front surface 21 of an upper microelectronic unit 10k and the lower surface 22 of a lower microelectronic unit can bond adjacent microelectronic units 10k together.

The methods disclosed herein for forming via structures in semiconductor elements can be applied to a microelectronic substrate, such as a single semiconductor chip, or can be applied simultaneously to a plurality of individual semiconductor chips which can be held at defined spacings in a fixture or on a carrier for simultaneous processing. Alternatively, the methods disclosed herein can be applied to a microelectronic substrate or element including a plurality of semiconductor chips which are attached together in form of a wafer or portion of a wafer to perform processing as described above simultaneously with respect to a plurality of semiconductor chips on a wafer-level, panel-level or strip-level scale.

The structures discussed above provide extraordinary three-dimensional interconnection capabilities. These capabilities can be used with chips of any type. Merely by way of example, the following combinations of chips can be included in structures as discussed above: (i) a processor and memory used with the processor; (ii) plural memory chips of the same type; (iii) plural memory chips of diverse types, such as DRAM and SRAM; (iv) an image sensor and an image processor used to process the image from the sensor; (v) an application-specific integrated circuit ("ASIC") and memory.

Figure 25:
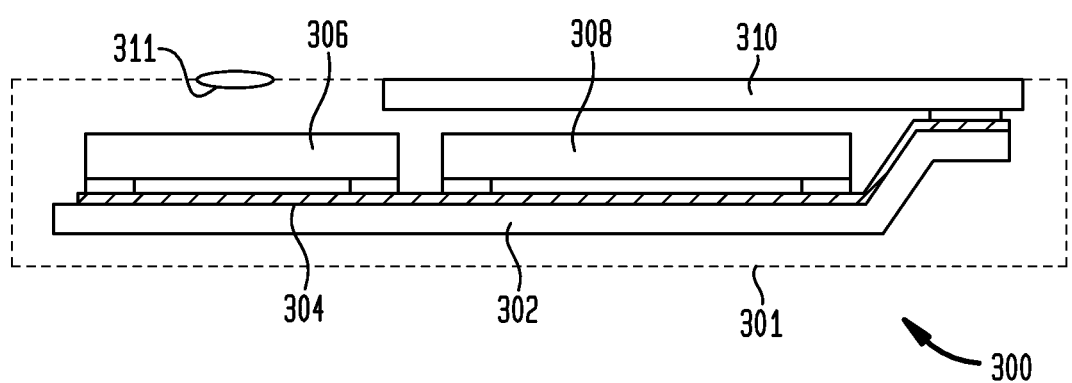
FIG. 25 is a schematic depiction of a system according to one embodiment of the invention.

The structures discussed above can be utilized in construction of diverse electronic systems. For example, a system 300 in accordance with a further embodiment of the invention includes a structure 306 as described above in conjunction with other electronic components 308 and 310. In the example depicted, component 308 is a semiconductor chip whereas component 310 is a display screen, but any other components can be used. Of course, although only two additional components are depicted in FIG. 25 for clarity of illustration, the system may include any number of such components. The structure 306 as described above may be, for example, a microelectronic unit as discussed above in connection with FIG. 1, or a structure incorporating plural microelectronic units as discussed with reference to FIG. 10. In a further variant, both may be provided, and any number of such structures may be used.

Structure 306 and components 308 and 310 are mounted in a common housing 301, schematically depicted in broken lines, and are electrically interconnected with one another as necessary to form the desired circuit. In the exemplary system shown, the system includes a circuit panel 302 such as a flexible printed circuit board, and the circuit panel includes numerous conductors 304, of which only one is depicted in FIG. 25, interconnecting the components with one another. However, this is merely exemplary; any suitable structure for making electrical connections can be used.

The housing 301 is depicted as a portable housing of the type usable, for example, in a cellular telephone or personal digital assistant, and screen 310 is exposed at the surface of the housing. Where structure 306 includes a light-sensitive element such as an imaging chip, a lens 311 or other optical device also may be provided for routing light to the structure. Again, the simplified system shown in FIG. 25 is merely exemplary; other systems, including systems commonly regarded as fixed structures, such as desktop computers, routers and the like can be made using the structures discussed above.

The vias and via conductors disclosed herein can be formed by processes such as those disclosed in greater detail in the co-pending, commonly assigned U.S. patent application Ser. Nos. 12/842,717, 12/842,651, 12/842,612, 12/842,669, 12/842,692, and 12/842,587, filed on Jul. 23, 2010, and in published U.S. Patent Application Publication No. 2008/0246136, the disclosures of which are incorporated by reference herein.

Although the invention herein has been described with reference to particular embodiments, it is to be understood that these embodiments are merely illustrative of the principles and applications of the present invention. It is therefore to be understood that numerous modifications may be made to the illustrative embodiments and that other arrangements may be devised without departing from the spirit and scope of the present invention as defined by the appended claims.

It will be appreciated that the various dependent claims and the features set forth therein can be combined in different ways than presented in the initial claims. It will also be appreciated that the features described in connection with individual embodiments may be shared with others of the described embodiments.

The invention claimed is:

1. A semiconductor assembly, comprising:
a semiconductor element having a front surface, a rear surface remote from the front surface, and an opening extending from the rear surface partially through the thickness of the semiconductor element, the semiconductor element further including a plurality of conductive pads at the front surface, and
a hole extending through the conductive pads and partially through the thickness of the semiconductor element, the hole meeting the opening at a location between the front and rear surfaces, wherein at the location where the hole and the opening meet, interior surfaces of the hole and the opening extend at different angles relative to the rear surface such that there is a step change between slopes of the interior surfaces of the hole and the opening;
a continuous dielectric layer partially overlying the respective conductive pads at a location above the respective conductive pads and overlying an interior surface of the semiconductor material within the hole and the opening;
a conductive element electrically contacting the conductive pads, the conductive element having a first portion exposed at the rear surface for electrical connection with an external device, the conductive element having a second portion overlying the continuous dielectric layer;
wherein the first portion of the conductive element having a first internal space filled with a dielectric region within the opening and the second portion of the conductive element having a second internal space within the hole; and
an outer surface of the dielectric region is located above but parallel to a plane defined by the rear surface and located below a plane defined a contact surface of the first portion of the conductive element exposed at the rear surface.

2. A semiconductor assembly as claimed in claim 1, wherein the conductive pads have an outwardly facing surface facing away from the semiconductor element, wherein at least a portion of the dielectric layer contacts the outwardly-facing surface.

3. A semiconductor assembly as claimed in claim 1, wherein the conductive element includes a conductive interconnect coupled to the conductive pad and a conductive contact coupled to the conductive interconnect, the conductive contact being exposed at the rear surface.

4. A semiconductor assembly as claimed in claim 3, wherein the opening has a first width in a lateral direction along the rear surface, and the conductive contact has a second width in the lateral direction, the first width being greater than the second width.

5. A semiconductor assembly as claimed in claim 1, wherein the semiconductor element includes a plurality of active semiconductor devices and the plurality of conductive pads are electrically connected with at least one of the plurality of active semiconductor devices.

6. A semiconductor assembly as claimed in claim 1, wherein the conductive pads have an outwardly facing surface facing away from the semiconductor element, wherein at least a portion of the at least one conductive element overlies the outwardly-facing surface and is electrically connected thereto.

7. A semiconductor assembly as claimed in claim 1, wherein the conductive element includes a conductive interconnect exposed at the rear surface for electrical connection to an external device, the conductive interconnect extending into the opening, and a conductive via, extending within the hole and coupled to the conductive interconnect and the conductive pads.

8. A semiconductor assembly as claimed in claim 7, wherein the conductive interconnect overlies an inner surface of the opening, the conductive interconnect conforming to a contour of the opening.

9. A semiconductor assembly as claimed in claim 8, wherein the conductive interconnect extends along a portion of the inner surface of the opening.

* * * * *